US012813095B2

(12) United States Patent
Moon et al.

(10) Patent No.: US 12,813,095 B2
(45) Date of Patent: Nov. 24, 2026

(54) DISPLAY APPARATUS AND METHOD OF MANUFACTURING THE SAME

(71) Applicant: Samsung Display Co., LTD., Yongin-si (KR)

(72) Inventors: Sunggwon Moon, Yongin-si (KR); Donghan Kang, Yongin-si (KR); Jeehoon Kim, Yongin-si (KR); Seungsok Son, Yongin-si (KR); Shinhyuk Yang, Yongin-si (KR); Woogeun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 326 days.

(21) Appl. No.: 18/529,388

(22) Filed: Dec. 5, 2023

(65) Prior Publication Data

US 2024/0276794 A1 Aug. 15, 2024

(30) Foreign Application Priority Data

Feb. 9, 2023 (KR) ........................ 10-2023-0017256

(51) Int. Cl.

| | |
|---|---|
| ***H10K 59/124*** | (2023.01) |
| ***H10K 59/12*** | (2023.01) |
| ***H10K 59/123*** | (2023.01) |
| ***H10K 59/131*** | (2023.01) |
| ***H10K 71/20*** | (2023.01) |

(52) U.S. Cl.

CPC ....... *H10K 59/124* (2023.02); *H10K 59/1201* (2023.02); *H10K 59/123* (2023.02); *H10K 59/131* (2023.02); *H10K 71/20* (2023.02)

(58) Field of Classification Search

CPC ............. H10K 59/124; H10K 59/1201; H10K 59/123; H10K 59/131; H10K 71/20; H10K 59/1213; H10K 71/00; H10K 59/873; H10K 71/211; H10K 71/60

See application file for complete search history.

(56) References Cited

U.S. PATENT DOCUMENTS 8,603,845 B2 12/2013 Choi et al.
10,403,845 B2 * 9/2019 Lee .................... H10K 59/1201
(Continued)

FOREIGN PATENT DOCUMENTS

CN 114744015 A 7/2022
KR 1020130005854 A 1/2013
(Continued)

*Primary Examiner* — Victor A Mandala
(74) *Attorney, Agent, or Firm* — CANTOR COLBURN LLP

(57) ABSTRACT

A display apparatus includes: a transistor disposed above a substrate and including a semiconductor layer, a gate electrode overlapping the semiconductor layer, and at least one source-drain electrode; a first inorganic insulating layer disposed above the transistor; a first organic insulating layer disposed above the first inorganic insulating layer; a power line disposed above the first organic insulating layer and including a first conductive layer and a second conductive layer on the first conductive layer; and a light-emitting diode disposed above the second organic insulating layer and including a pixel electrode, an opposite electrode, and an intermediate layer disposed between the pixel electrode and the opposite electrode.

9 Claims, 16 Drawing Sheets

(56) References Cited

U.S. PATENT DOCUMENTS

| | | | | |
|---|---|---|---|---|
| 10,811,641 | B2 | 10/2020 | Kim et al. | |
| 11,049,929 | B2 | 6/2021 | Jeon et al. | |
| 12,382,808 | B2 * | 8/2025 | Lim | H10K 59/1216 |
| 2018/0108724 | A1 * | 4/2018 | Lee | H05K 1/0277 |
| 2019/0123126 | A1 | 4/2019 | Song et al. | |
| 2019/0296099 | A1 * | 9/2019 | Lee | H10K 59/122 |
| 2020/0219952 | A1 | 7/2020 | Kim et al. | |
| 2020/0403047 | A1 * | 12/2020 | Oh | H10K 59/122 |
| 2021/0091161 | A1 | 3/2021 | Baek et al. | |
| 2021/0175292 | A1 * | 6/2021 | Bang | G06F 3/0412 |
| 2021/0217839 | A1 * | 7/2021 | Choi | H10K 59/122 |
| 2021/0273195 | A1 * | 9/2021 | Lee | H10K 59/123 |
| 2022/0013609 | A1 * | 1/2022 | Won | H10K 59/1213 |
| 2022/0028952 | A1 * | 1/2022 | Kang | H10K 59/131 |
| 2022/0059637 | A1 * | 2/2022 | Choi | G09G 3/3233 |
| 2022/0115470 | A1 * | 4/2022 | Kim | H10D 10/821 |
| 2022/0199745 | A1 * | 6/2022 | Baek | H10K 59/124 |
| 2022/0208924 | A1 * | 6/2022 | Choi | H10D 86/481 |
| 2022/0285647 | A1 * | 9/2022 | Cho | H10K 59/122 |
| 2023/0079920 | A1 * | 3/2023 | Yang | G02B 19/0019 359/641 |
| 2023/0352455 | A1 * | 11/2023 | Im | H10D 86/441 |
| 2023/0371307 | A1 * | 11/2023 | Lee | H10K 59/121 |

FOREIGN PATENT DOCUMENTS

| | | | |
|---|---|---|---|
| KR | 1020190058742 | A | 5/2019 |
| KR | 1020200143623 | A | 12/2020 |
| KR | 20210035358 | A | 4/2021 |
| KR | 102293365 | B1 | 8/2021 |

* cited by examiner

DISPLAY APPARATUS AND METHOD OF MANUFACTURING THE SAME

This application claims priority to Korean Patent Application No. 10-2023-0017256, filed on Feb. 9, 2023, and all the benefits accruing therefrom under 35 U.S.C. § 119, the content of which in its entirety is herein incorporated by reference.

BACKGROUND

1. Field

The present disclosure relates to a display apparatus and a method of manufacturing the same.

2. Description of the Related Art

In general, a display apparatus, for example, an organic light-emitting display apparatus, includes a light-emitting diode including a pixel electrode, an emission layer, and an opposite electrode, a transistor electrically connected to the light-emitting diode, and the like. The pixel electrode of the light-emitting diode may receive an electrical signal through the transistor, and the opposite electrode may receive a voltage through a power line. The display apparatus displays images by allowing light emitted from the emission layer of the light-emitting diode to be extracted to the outside. To this end, the display apparatus may include a pad and receive signals from an integrated circuit device and/or a printed circuit board through the pad.

SUMMARY

In an existing display apparatus, power lines may possibly be damaged in a process performed after a process of forming power lines.

The disclosure is to solve various problems including the aforementioned one and provides a display apparatus with a low occurrence rate of defects during manufacture and a method of manufacturing the display apparatus. However, this is merely an example, and the scope of the present disclosure is not limited thereto.

Additional aspects will be set forth in part in the description which follows and, in part, will be apparent from the description, or may be learned by practice of the presented embodiments of the disclosure.

According to one or more embodiments, a display apparatus includes: a transistor disposed above a substrate and including a semiconductor layer, a gate electrode overlapping the semiconductor layer, and at least one source-drain electrode, a first inorganic insulating layer disposed above the transistor, a first organic insulating layer disposed above the first inorganic insulating layer, a power line disposed above the first organic insulating layer and including a first conductive layer and a second conductive layer on the first conductive layer, a first protective layer disposed between the first organic insulating layer and the power line and having a shape corresponding to a shape of the power line in a plan view, a second inorganic insulating layer disposed above the power line, a second organic insulating layer disposed above the second inorganic insulating layer, and a light-emitting diode disposed above the second organic insulating layer and including a pixel electrode, an opposite electrode, and an intermediate layer disposed between the pixel electrode and the opposite electrode.

The pixel electrode may be electrically connected to the at least one source-drain electrode through a first contact hole, the first contact hole may include a first portion, which is defined by the second organic insulating layer, the second inorganic insulating layer, and an upper portion of the first organic insulating layer, and a second portion, which is defined by the first inorganic insulating layer and a lower portion of the first organic insulating layer, and at a border between the first portion and the second portion, the first portion may have a first width, and the second portion may have a second width that is less than the first width in the plan view.

The border between the first portion and the second portion may be located between an upper surface and a lower surface of the first organic insulating layer.

The display apparatus may further include a pad including a fourth conductive layer, a fifth conductive layer, and a sixth conductive layer, which are sequentially stacked between the first organic insulating layer and the second inorganic insulating layer, and a second protective layer disposed between the first organic insulating layer and the pad and having a shape corresponding to a shape of the pad in the plan view, and the sixth conductive layer may include metal oxide.

The display apparatus may further include a pad opening defined by the second inorganic insulating layer and the second organic insulating layer and overlapping the pad in the plan view.

The power line may further include a third conductive layer disposed between the second conductive layer and the second inorganic insulating layer, and the sixth conductive layer may include the same material as the third conductive layer.

The display apparatus may further include: a pad disposed between the substrate and the first inorganic insulating layer and including a fourth conductive layer, a fifth conductive layer, and a sixth conductive layer, and a pad opening defined by the first inorganic insulating layer and the first organic insulating layer and overlapping the pad in the plan view, and the sixth conductive layer may include metal oxide.

The at least one source-drain electrode may include a first sub-layer, a second sub-layer, and a third sub-layer which are sequentially stacked, and the sixth conductive layer may include the same material as the third sub-layer.

The second inorganic insulating layer may contact the first protective layer.

According to one or more embodiments, a display apparatus includes: a transistor disposed above a substrate and including a semiconductor layer, a gate electrode overlapping the semiconductor layer in a plan view, and at least one source-drain electrode, a first inorganic insulating layer disposed above the transistor, a first organic insulating layer disposed above the first inorganic insulating layer, a power line including a first molybdenum titanium (MoTi) layer disposed above the first organic insulating layer and a second conductive layer disposed above the first molybdenum titanium (MoTi) layer, a second inorganic insulating layer disposed above the power line, a second organic insulating layer disposed above the second inorganic insulating layer, and a light-emitting diode disposed above the second organic insulating layer and including a pixel electrode, an opposite electrode, and an intermediate layer disposed between the pixel electrode and the opposite electrode.

In the plan view, a shape of the first molybdenum titanium (MoTi) layer may correspond to a shape of the second conductive layer, and the second inorganic insulating layer may contact the first molybdenum titanium (MoTi) layer.

The display apparatus may further include: a pad including a second molybdenum titanium layer, a fifth conductive layer, and a sixth conductive layer which are sequentially stacked between the first organic insulating layer and the second inorganic insulating layer, and the sixth conductive layer may include metal oxide.

The pixel electrode may be electrically connected to the at least one source-drain electrode through a first contact hole, the first contact hole may include a first portion, which is defined by the second organic insulating layer, the second inorganic insulating layer, and an upper portion of the first organic insulating layer, and a second portion, which is defined by the first inorganic insulating layer and a lower portion of the first organic insulating layer, and, at a border between the first portion and the second portion, the first portion may have a first width, and the second portion may have a second width that is less than the first width in the plan view.

According to one or more embodiments, a method of manufacturing a display apparatus includes: forming, on a substrate, a transistor including a semiconductor layer, a gate electrode overlapping the semiconductor layer in a plan view, and at least one source-drain electrode; sequentially forming, on the transistor, a first inorganic insulating layer and a first organic insulating layer and forming a previous contact hole by removing a first portion of the first inorganic insulating layer and a portion of the first organic insulating layer; forming, on the first organic insulating layer, a power line including a first protective layer including an inorganic insulating material, a first conductive layer disposed above the first protective layer, and a second conductive layer disposed above the first conductive layer; sequentially forming, on the power line, a second inorganic insulating layer and a second organic insulating layer; forming a first contact hole by removing a second portion of the first inorganic insulating layer, a portion of the second inorganic insulating layer, and a portion of the second organic insulating layer; and forming, on the second organic insulating layer, a light-emitting diode including a pixel electrode, an opposite electrode, and an intermediate layer disposed between the pixel electrode and the opposite electrode.

The forming of the previous contact hole may include: forming a previous-sub hole penetrating the first organic insulating layer, and forming a groove by removing the first portion of the first inorganic insulating layer through the previous-sub hole.

In the sequentially forming of the second inorganic insulating layer and the second organic insulating layer, the second inorganic insulating layer may contact the first inorganic insulating layer through the previous contact hole.

The forming of the first contact hole may include: forming, in the plan view, a sub-hole overlapping the previous contact hole and penetrating the second organic insulating layer, and forming, through the sub-hole, a first portion of the first contact hole and a second portion of the first contact hole, where the first portion of the first contact hole may be defined by the second organic insulating layer, the second inorganic insulating layer, and an upper portion of the first organic insulating layer, and the second portion of the first contact hole may be defined by the first inorganic insulating layer and a lower portion of the first organic insulating layer.

At a border between the first portion and the second portion, the first portion may have a first width, and the second portion may have a second width that is less than the first width in the plan view.

In the forming of the power line, the first protective layer, the first conductive layer, and the second conductive layer may be patterned through the same mask process.

The method of manufacturing the display apparatus may further include: forming, on the first organic insulating layer, a pad including a second protective layer including an inorganic insulating material, and a fourth conductive layer, a fifth conductive layer, and a sixth conductive layer, which are sequentially stacked on the second protective layer, and the second protective layer, the fourth conductive layer, the fifth conductive layer, and the sixth conductive layer may be patterned through the same mask process.

The forming of the power line may further include forming a third conductive layer on the second conductive layer, and the third conductive layer may include the same material as the sixth conductive layer.

Other aspects, features, and advantages other than those described above will become apparent from the following detailed description, claims and drawings for carrying out the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
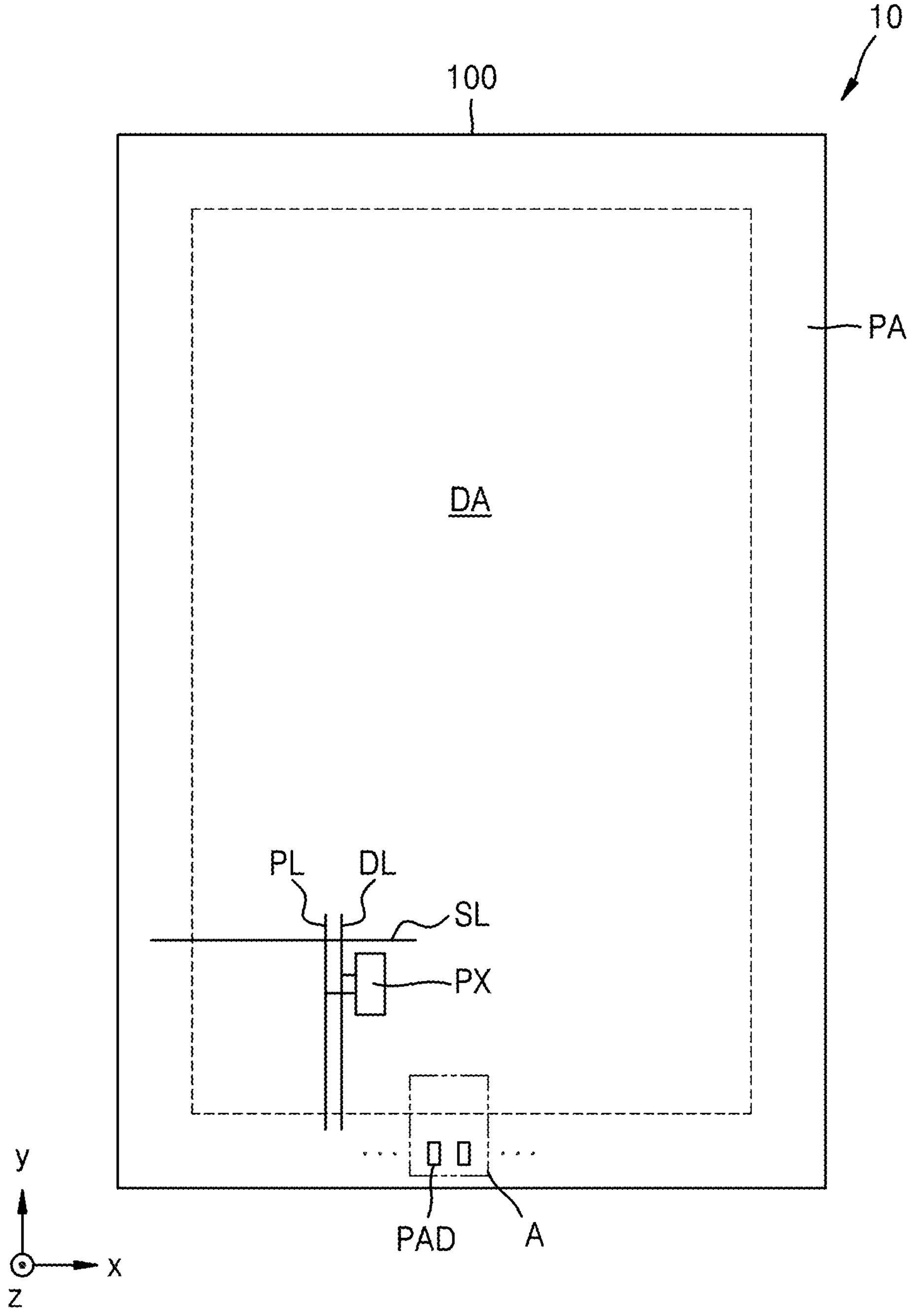
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, particular embodiments will be shown in the drawings and described in detail in the written description. The attached drawings for illustrating preferred embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

Hereinafter, one or more embodiments of the disclosure will be described in detail with reference to the accompanying drawings. Like elements in the drawings denote like elements, and repeated descriptions thereof are omitted.

It will be understood that although the terms "first," "second," etc. may be used herein to describe various elements, these elements should not be limited by these terms, and these elements are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

It will be understood that when a layer, region, or component is referred to as being connected to another layer, region, or component, it can be directly or indirectly connected to the other layer, region, or component. For example, when a layer, region, or component is referred to as being electrically connected to another layer, region, or component, it can be directly or indirectly electrically connected to the other layer, region, or component.

In the present embodiment, an expression such as "A and/or B" indicates A, B, or A and B. Also, an expression such as "at least one of A and B" indicates A, B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. In other words, since sizes and thicknesses of elements in the drawings are arbitrarily illustrated for convenience of explanation, the following embodiments are not limited thereto.

FIG. 1 is a schematic plan view of a display apparatus according to an embodiment.

Referring to FIG. 1, a display apparatus 10 including a display panel may be any type of display apparatus. For example, the display apparatus 10 may be various products, such as a smartphone, a tablet computer, a laptop, a television, or a billboard.

The display apparatus 10 includes a display area DA and a peripheral area PA outside the display area DA. FIG. 1 shows that the display area DA has a rectangular shape. However, one or more embodiments are not limited thereto. The display area DA may have various shapes, e.g., a circle, an oval, a polygon, and other specific shapes.

The display area DA is an area where images are displayed, and a plurality of pixels PX may be arranged therein. Each pixel PX may be defined as, for example, an emission area where red light, green light, or blue light is emitted. The pixel PX may include a light-emitting diode, such as an organic light-emitting diode. The light-emitting diode of the pixel PX may be connected to a pixel circuit including a thin-film transistor, a storage capacitor, and the like. The pixel circuit may be connected to a scan line SL configured to transmit a scan signal, a data line DL crossing the scan line SL and configured to transmit a data signal, a driving power line PL configured to supply a driving voltage, and the like. The scan line SL may extend in a first direction (e.g., an x direction), and the data line DL and the driving power line PL may each extend in a second direction (e.g., a y direction) crossing the first direction.

The pixel PX may emit light having a brightness corresponding to an electrical signal transmitted from a pixel circuit electrically connected to the pixel PX. In the display area DA, certain images may be displayed using light emitted from the pixels PX.

The peripheral area PA is an area where no pixel Ps are arranged, and images are not displayed therein. In the peripheral area PA, a power line, etc. configured to drive the pixels PX may be located. Also, a pad PAD may be arranged in the peripheral area PA, wherein an integrated circuit device, e.g., a printed circuit board or a driver IC including driving circuitry, may be electrically connected to the pad PAD.

For reference, because the display apparatus 10 includes a substrate 100, it may be described that the substrate 100 includes the display area DA and the peripheral area PA.

Hereinafter, an organic light-emitting display apparatus is described as the display apparatus 10 according to an embodiment. However, the display apparatus 10 is not limited thereto. In another embodiment, for example, the display apparatus 10 may be an inorganic light-emitting display apparatus, an inorganic EL display apparatus, or a quantum dot light-emitting display apparatus.

Figure 2:
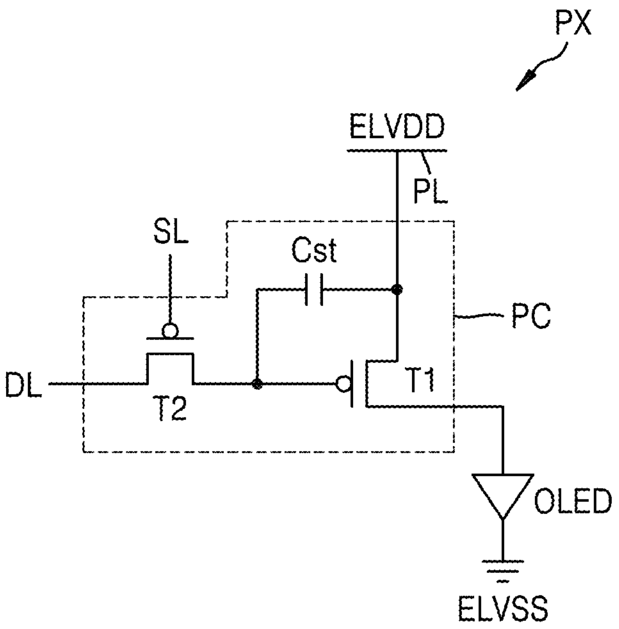
FIG. 2 is an equivalent circuit diagram of a pixel included in a display apparatus, according to an embodiment.

FIG. 2 is an equivalent circuit diagram of a pixel included in a display apparatus, according to an embodiment.

Referring to FIG. 2, one pixel PX may include a pixel circuit PC and an organic light-emitting diode OLED electrically connected thereto.

The pixel circuit PC may include a first transistor T1, a second transistor T2, and a storage capacitor Cst. The second transistor T2 may be a switching transistor, connected to the scan line SL and the data line DL, and turned on in response to a switching signal that is input through the scan line SL, thereby being configured to transmit a data signal, which is input through the data line DL, to the first transistor T1. An end of the storage capacitor Cst may be electrically connected to the second transistor T2, and the other end thereof may be electrically connected to the driving power line PL, and the storage capacitor Cst may store a voltage corresponding to a difference between a voltage from the second transistor T2 and a driving power voltage ELVDD supplied to the driving power line PL.

The first thin-film transistor T1 may be a driving transistor, connected to the driving power line PL and the storage capacitor Cst, and configured to control a size of a driving current flowing to the organic light-emitting diode OLED from the driving power line PL according to the voltage stored in the storage capacitor Cst. The organic light-emitting diode OLED may emit light having a certain brightness because of the driving current. An opposite electrode (530, see FIG. 4A) of the organic light-emitting diode OLED may receive a common power voltage ELVSS.

FIG. 2 shows that the pixel circuit PC includes two transistors and one storage capacitor, but one or more embodiments are not limited thereto. For example, the number of transistors or the number of storage capacitors may vary depending on the design of the pixel circuit PC.

Figure 3:
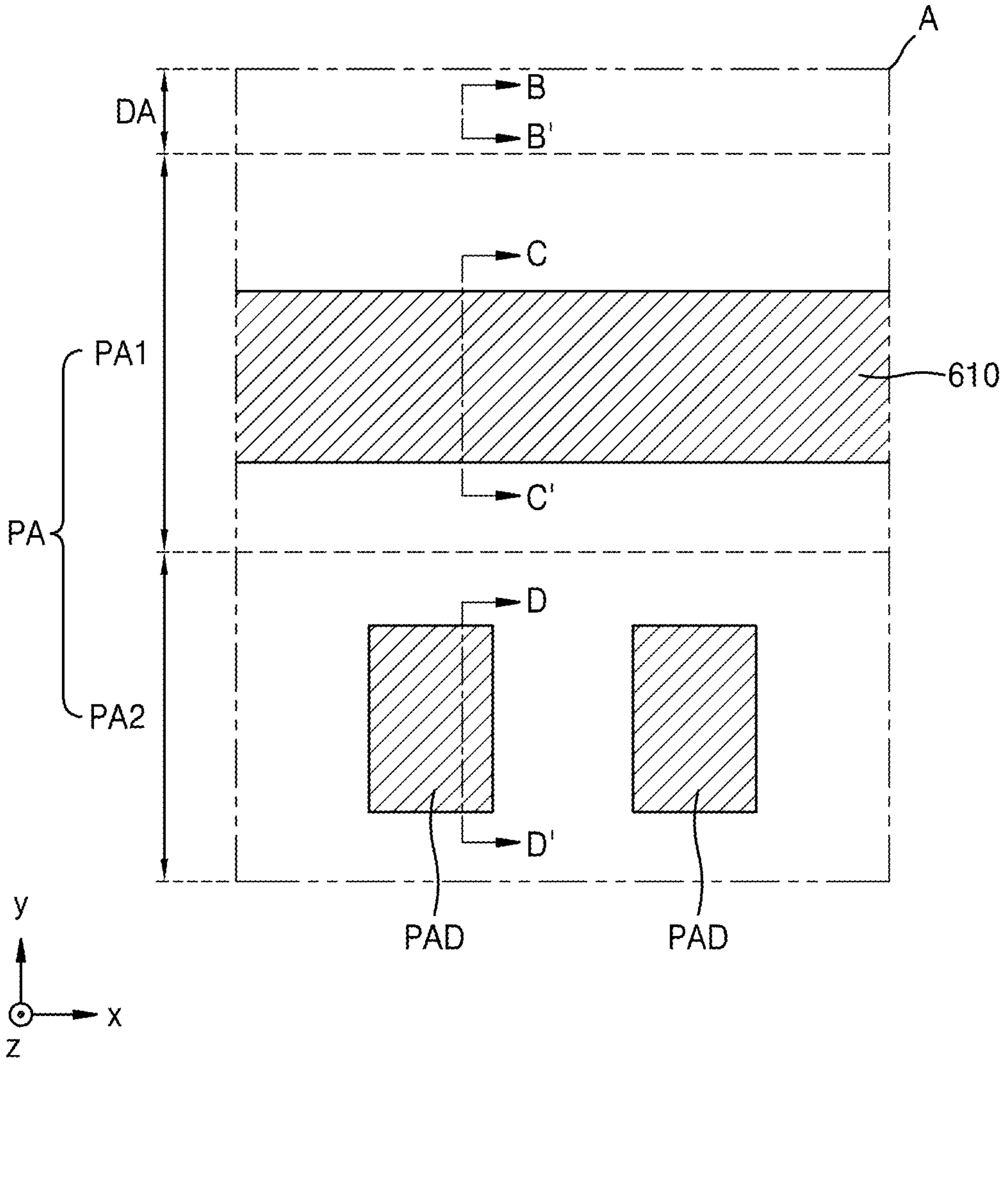
FIG. 3 is a schematic plan view of region A of the display apparatus of FIG. 1.

FIG. 3 is a schematic plan view of region A of the display apparatus of FIG. 1.

As shown in FIG. 3, the substrate 100 may include the display area DA and the peripheral area PA. The peripheral area PA may include a first peripheral area PA1 and a second peripheral area PA2. The first peripheral area PA1 may be arranged outside the display area DA to at least surround the same. The second peripheral area PA2 may be arranged outside the first peripheral area PA1. In an embodiment, for example, the first peripheral area PA1 may be located between the second peripheral area PA2 and the display area DA.

A power line 610 may be arranged in the first peripheral area PA1. The power line 610 may be part of large wiring through which a power voltage for driving an organic light-emitting diode (OLED, see FIG. 4A) is applied. In an embodiment, for example, the power line 610 may be a common power voltage (ELVSS, see FIG. 2) supply line in which a potential of the opposite electrode (530, see FIG. 4A) is constant in contact with the opposite electrode 530. Alternatively, the power line 610 may be a driving power voltage (ELVDD, see FIG. 2) through which power is supplied to a thin-film transistor (TFT, see FIG. 4A). In an embodiment, when the power line 610 is the common power voltage supply line, the power line 610 may have a loop shape surrounding the display area DA in a plan view.

The pad PAD may be arranged in the second peripheral area PA2, wherein an integrated circuit device, e.g., a printed circuit board or a driver IC, is electrically connected to the pad PAD. Signal lines, e.g., the data lines (DL, see FIG. 1), which are arranged in the display area DA may be electrically connected to the pads PAD through input lines (not shown) arranged in the peripheral area PA.

Figure 4A:
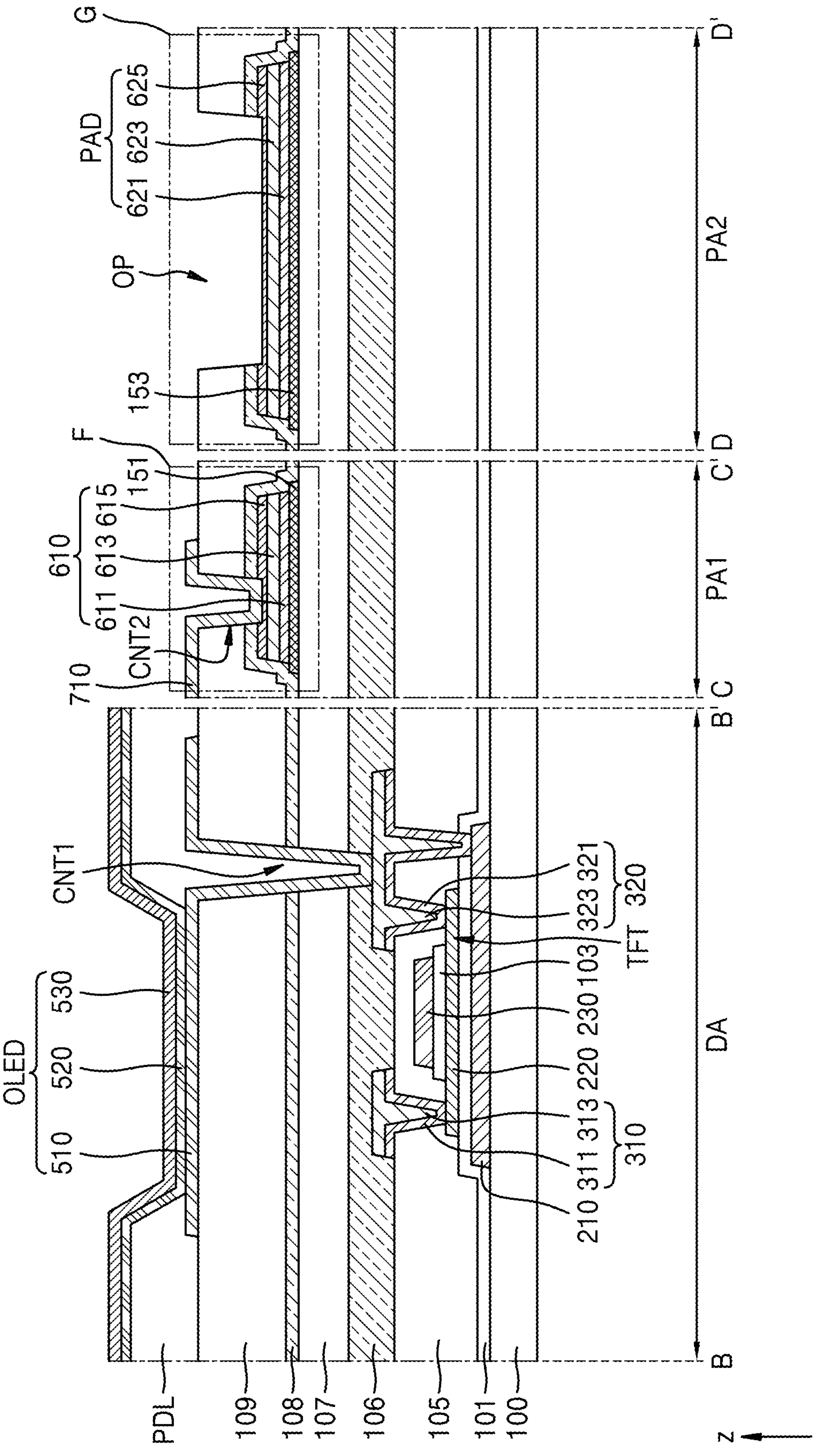
FIGS. 4A and 4B are schematic cross-sectional views of a display apparatus according to an embodiment.
Figure 4B:
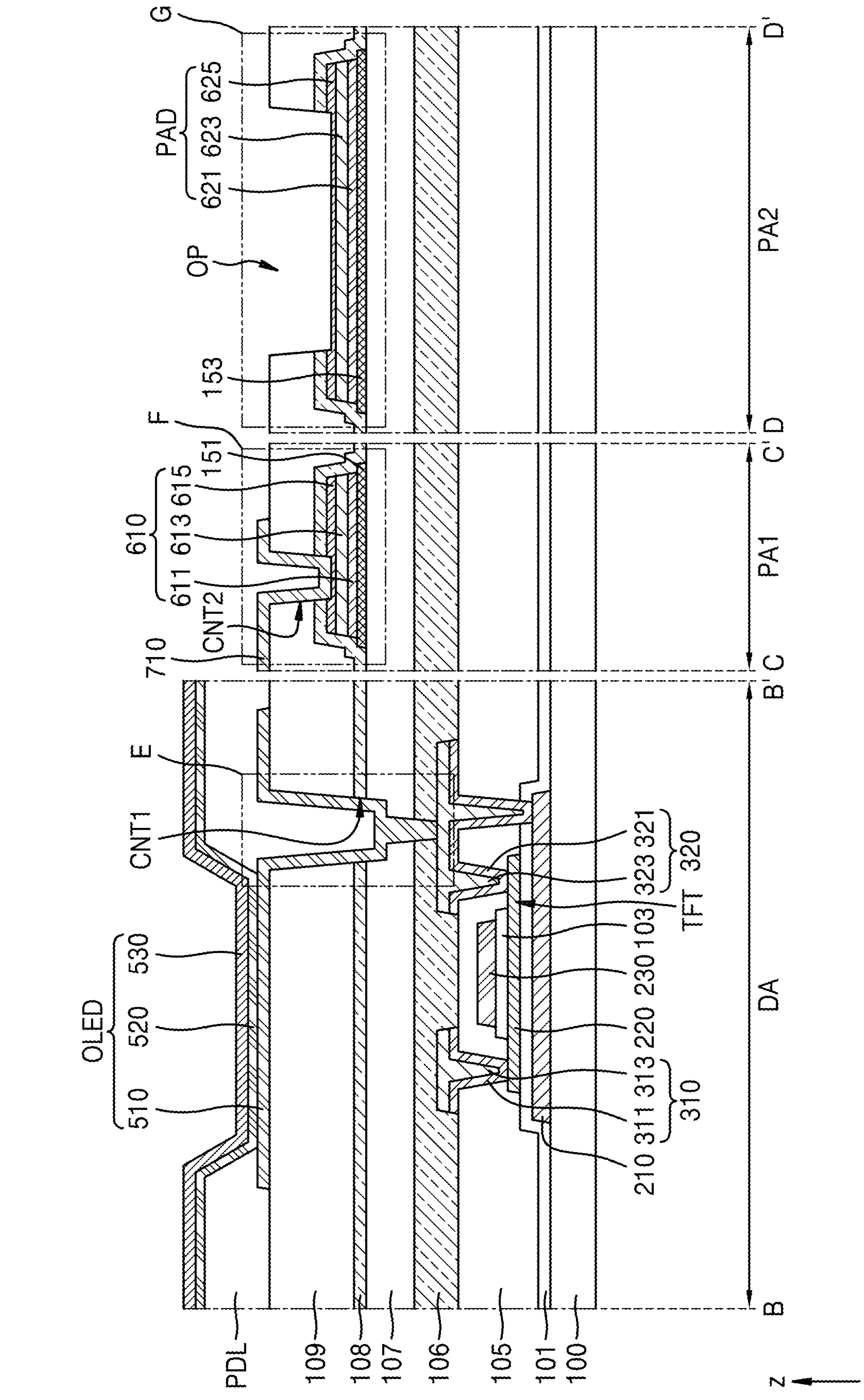

FIGS. 4A and 4B are schematic cross-sectional views of a display apparatus according to an embodiment. FIGS. 4A and 4B show cross-sections of the display apparatus of FIG. 3, taken along a line B-B', a line C-C', and a line D-D'.

Referring to FIGS. 4A and 4B, the display apparatus includes the substrate 100. The substrate 100 may include various materials that are flexible or bendable. In an embodiment, for example, the substrate 100 may include glass, metals, or polymer resin. Also, the substrate 100 may include polymer resin, such as polyethersulphone, polyacrylate, polyetherimide, polyethylene naphthalate, polyethylene terephthalate, polyphenylene sulfide, polyarylate, polyimide, polycarbonate, or cellulose acetate propionate. Various modifications may be made to the substrate 100; for example, the substrate 100 may have a multilayered structure that includes two layers including the above polymer resin and a barrier layer including an inorganic material (e.g., silicon oxide, silicon nitride, silicon oxynitride, or the like) and arranged between the two layers.

A buffer layer 101 may be disposed above the substrate 100. The buffer layer 101 may decrease or prevent the penetration of foreign materials, moisture, or external air from the bottom of the substrate 100 and may provide a flat surface on the substrate 100. The buffer layer 101 may include an inorganic material, such as silicon oxide, silicon nitride, and/or silicon oxynitride, an organic material, or an organic and inorganic compound, and may have a single-layer structure of an organic material or an inorganic material or a multilayered structure that includes both.

The organic light-emitting diode OLED and the thin-film transistor TFT electrically connected thereto may be disposed above the substrate 100. The electrical connection of the organic light-emitting diode OLED to the thin-film transistor TFT may be understood as the electrical connection of a pixel electrode 510 of the organic light-emitting diode OLED to the thin-film transistor TFT. In an embodiment, the thin-film transistor TFT may be a driving transistor.

The thin-film transistor TFT may include a semiconductor layer 220 including amorphous silicon, polycrystalline silicon, an organic semiconductor material, or an oxide semiconductor material. The thin-film transistor TFT may include a gate electrode 230, a first source-drain electrode 310, and a second source-drain electrode 320. The gate electrode 230 may include various conductive materials and have various layer structures. In an embodiment, for example, the gate electrode 230 may include a molybdenum (Mo) layer and an aluminum (Al) layer. Alternatively, the gate electrode 230 may include a titanium nitride (TiN) layer, an Al layer, and/or a titanium (Ti) layer.

A gate insulating layer 103 may be disposed between the semiconductor layer 220 and the gate electrode 230. The gate insulating layer 103 may include an inorganic insulating material, such as silicon oxide, silicon nitride, and/or silicon oxynitride. FIGS. 4A and 4B show that the gate insulating layer 103 is patterned together with the gate electrode 230 in the same mask process and thus has the shape corresponding to the shape of the gate electrode 230 in a plan view, but one or more embodiments are not limited thereto. In another embodiment, for example, the gate insulating layer 103 may cover the entirety of the display area DA. In the present specification, the description "the shape of A corresponds to the shape of B in a plan view" may indicate that A and B are patterned together through the same mask process so that the boundary of A overlaps the boundary of B when viewed in a plan view. In this case, the width of A may be less or greater than the width of B because of a difference in etch rates of A and B, etc., and even in this case, the shape of A may correspond to the shape of B.

An interlayer-insulating layer 105 may be disposed above the gate electrode 230. The interlayer-insulating layer 105 may include an inorganic insulating material, such as silicon oxide, silicon nitride, and/or silicon oxynitride, and may have a single-layer structure or a multilayered structure including the above material.

The first source-drain electrode 310 and the second source-drain electrode 320 may be disposed above the interlayer-insulating layer 105. Any one of the first source-drain electrode 310 and the second source-drain electrode 320 may contact a source area of the semiconductor layer 220, and the other thereof may contact a drain area of the semiconductor layer 220. In other words, any one of the first source-drain electrode 310 and the second source-drain electrode 320 may be a source electrode, and the other thereof may be a drain electrode. In an embodiment, the semiconductor layer 220 of the thin-film transistor TFT may be connected to a semiconductor layer 220 of another adjacent thin-film transistor TFT, and any one of the first source-drain electrode 310 and the second source-drain electrode 320 may be omitted.

The first source-drain electrode 310 and the second source-drain electrode 320 may each have a multilayered structure. The first source-drain electrode 310 may include a first sub-layer 311 and a second sub-layer 313, and the second source-drain electrode 320 may include a third sub-layer 321 and a fourth sub-layer 323. The first sub-layer 311 may include the same material as the third sub-layer 321. The second sub-layer 313 may include the same material as the fourth sub-layer 323. In the present specification, the description "A includes the same material as B" indicates that A and B are formed through the same deposition process and have the same composition, film quality, and/or layer structure.

In an embodiment, the first sub-layer 311 and the third sub-layer 321 may each include Ti. The second sub-layer 313 and the fourth sub-layer 323 may each include Al or copper (Cu).

A lower metal layer 210 may be disposed between the substrate 100 and the semiconductor layer 220. In an embodiment, for example, the lower metal layer 210 may be disposed between the substrate 100 and the buffer layer 101. In an embodiment, the second source-drain electrode 320 may contact the lower metal layer 210. In an embodiment, a portion of the lower metal layer 210 may be a lower electrode of the storage capacitor (Cst, see FIG. 2). For reference, the storage capacitor Cst may include an upper electrode overlapping the lower electrode, and the upper electrode is not shown in FIGS. 4A and 4B. However, the upper electrode may be disposed in the same layer and include the same material as the gate electrode 230. However, one or more embodiments are not limited thereto. In another embodiment, for example, the lower metal layer 210 may not contact the thin-film transistor TFT. In this case, the lower metal layer 210 may not contact the second source-drain electrode 320 and have an isolated shape.

According to necessity, the driving power voltage (ELVDD, see FIG. 2), which is a constant voltage, may be applied to the lower metal layer 210. In this case, the lower metal layer 210 may shield the thin-film transistor TFT. The lower metal layer 210 may include a metal material.

A first inorganic insulating layer 106 may be disposed above the first source-drain electrode 310 and the second source-drain electrode 320. The first inorganic insulating layer 106 may include silicon oxide, silicon nitride, and/or silicon oxynitride. The first inorganic insulating layer 106 may be formed through chemical vapor deposition ("CVD"). The formation method is also applied to the embodiments below and modified examples thereof.

A first organic insulating layer 107 may be disposed above the first inorganic insulating layer 106. The first organic insulating layer 107 may function as a planarization layer to provide a flat upper surface by burying uneven portions formed because of the thin-film transistor TFT. The first organic insulating layer 107 may include an organic insulating material. In an embodiment, for example, the first organic insulating layer 107 may include a general-purpose polymer, such as benzocyclobutene ("BCB"), polyimide, hexamethyldisiloxane ("HMDSO"), polymethylmethacrylate ("PMMA"), or polystyrene ("PS"), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The first inorganic insulating layer 106 may effectively prevent or reduce the damage to the first source-drain electrode 310 and the second source-drain electrode 320, where the damage is caused by gases, etc. generated from the first organic insulating layer 107 during the manufacturing of the display apparatus.

In the first peripheral area PA1, the power line 610 may be disposed above the first organic insulating layer 107. As described above, the power line 610 may be the common power voltage (ELVSS, see FIG. 2) supply line or the driving power voltage (ELVDD, see FIG. 2) supply line.

The power line 610 may include a first conductive layer 611 and a second conductive layer 613 which are sequentially stacked. The first conductive layer 611 and the second conductive layer 613 may include different conductive materials. The first conductive layer 611 may include Ti, and the second conductive layer 613 may include Al and/or Cu. In an embodiment, the power line 610 may further include a third conductive layer 615 disposed above the second conductive layer 613. The third conductive layer 615 may include metal oxide. In an embodiment, for example, the metal oxide may include indium tin oxide ("ITO").

A first protective layer 151 may be disposed between the power line 610 and the first organic insulating layer 107. The first protective layer 151 may include an inorganic insulating material, such as silicon oxide, silicon nitride, and/or silicon oxynitride. The first protective layer 151 may be formed through CVD.

In a plan view, the shape of the first protective layer 151 may correspond to the shape of the power line 610. In other words, the first protective layer 151 may be patterned together with the power line 610 through the same mask process. The power line 610 and the first protective layer 151 are described below in more detail with reference to FIG. 6.

In the second peripheral area PA2, the pad PAD may be disposed above the first organic insulating layer 107. The pad PAD may include a fourth conductive layer 621, a fifth conductive layer 623, and a sixth conductive layer 625 which are sequentially stacked. The fourth conductive layer 621, the fifth conductive layer 623, and the sixth conductive layer 625 may include different materials. The fourth conductive layer 621 may include Ti, the fifth conductive layer 623 may include Al or Cu, and the sixth conductive layer 625 may include metal oxide. Here, the metal oxide may include ITO.

In an embodiment, the fourth conductive layer 621 may include the same material as the first conductive layer 611. The fifth conductive layer 623 may include the same material as the fourth conductive layer 621, and the sixth conductive layer 625 may include the same material as the third conductive layer 615.

A second protective layer 153 may be disposed between the pad PAD and the first organic insulating layer 107. The second protective layer 153 may include an inorganic insulating material, such as silicon oxide, silicon nitride, and/or silicon oxynitride. The second protective layer 153 may be formed through CVD. In an embodiment, the first protective layer 151 may include the same material as the second protective layer 153.

In a plan view, the shape of the second protective layer 153 may correspond to the shape of the pad PAD. In other words, the second protective layer 153 may be patterned together with the pad PAD through the same mask process. The pad PAD and the second protective layer 153 are described below in more detail with reference to FIG. 7.

A second inorganic insulating layer 108 may be disposed above the first organic insulating layer 107 to cover the power line 610 and the pad PAD. The second inorganic insulating layer 108 may include silicon oxide, silicon nitride, and/or silicon oxynitride.

A second organic insulating layer 109 may be disposed above the second inorganic insulating layer 108. The second organic insulating layer 109 may function as a planarization layer to provide a flat upper surface to the organic light-emitting diode OLED. The second organic insulating layer 109 may include an organic insulating material. In an embodiment, for example, the second organic insulating layer 109 may include a general-purpose polymer, such as BCB, polyimide, HMDSO, PMMA, or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

In an embodiment, the second inorganic insulating layer 108 may directly contact the first protective layer 151 and the second protective layer 153. In an embodiment, for example, the power line 610 may be separated from the first organic insulating layer 107 and the second organic insulating layer 109 by the first protective layer 151 and the second inorganic insulating layer 108, respectively. The pad PAD may be separated from the first organic insulating layer 107 and the second organic insulating layer 109 by the second protective layer 153 and the second inorganic insulating layer 108, respectively. Therefore, the damage to the power line 610 and the pad PAD may be effectively prevented or reduced, where the damage is caused by gases, etc. which are generated from the first organic insulating layer 107 and the second organic insulating layer 109 during the manufacture of the display apparatus.

An opening OP may be arranged, wherein the opening OP overlaps the pad PAD and exposes an upper surface of the pad PAD from the second inorganic insulating layer 108 and the second organic insulating layer 109. The opening OP may be defined by the second inorganic insulating layer 108 and the second organic insulating layer 109. The pad PAD may be electrically connected to the integrated circuit device and/or the printed circuit board through the opening OP. The opening OP may be referred to as an "pad opening".

In the display area DA, the organic light-emitting diode OLED may be disposed above the second organic insulating layer 109. The organic light-emitting diode OLED may include, for example, the pixel electrode 510, the opposite electrode 530, and an intermediate layer 520 arranged therebetween and including an emission layer.

The pixel electrode 510 may contact the second source-drain electrode 320 through a first contact hole CNT1 penetrating the second organic insulating layer 109, the second inorganic insulating layer 108, the first organic insulating layer 107, and the first inorganic insulating layer 106 and may be electrically connected to the thin-film transistor TFT. In other words, the first contact hole CNT1 may be defined by the first inorganic insulating layer 106, the first organic insulating layer 107, the second inorganic insulating layer 108, and the second organic insulating layer 109.

In an embodiment, as shown in FIG. 4B, the first contact hole CNT1 may have a width that discontinuously changes between an upper surface and a lower surface of the first organic insulating layer 107 in a plan view.

The pixel electrode 510 may be a (semi-)light-transmissive electrode or a reflection electrode. In an embodiment, the pixel electrode 510 may include a reflection film including silver (Ag), magnesium (Mg), Al, platinum (Pt), palladium (Pd), gold (Au), nickel (Ni), neodymium (Nd), iridium (Ir), chromium (Cr), or a compound thereof, and a transparent or translucent electrode layer disposed on the reflection film. The transparent or translucent electrode layer may include at least one material selected from the group consisting of ITO, indium zinc oxide ("IZO"), zinc oxide (ZnO), indium oxide ($In_2O_3$), indium gallium oxide ("IGO"), and aluminum zinc oxide ("AZO"). In an embodiment, the pixel electrode 510 may have a stack structure of ITO/Ag/ITO.

The intermediate layer 520 of the organic light-emitting diode OLED may include an organic emission layer. The organic emission layer may include an organic material including a fluorescent or phosphorescent material emitting red light, green light, blue light, or white light. The organic emission layer may include a low-molecular-weight or a high-molecular-weight organic material, and on and under the organic emission layer, functional layers, such as a hole transport layer ("HTL"), a hole injection layer ("HIL"), an electron transport layer ("ETL"), and an electron injection layer ("EIL"), may be selectively arranged. The aforementioned layers may be formed through inkjet printing, screen printing, or laser induced thermal imaging ("LITI").

The intermediate layer 520 is not limited thereto and may have various structures. The intermediate layer 520 may include a layer integrally formed as a single body over the pixel electrodes 510 and a layer patterned to correspond to each of the pixel electrodes 510.

The opposite electrode 530 may be disposed to cover the display area DA. The opposite electrode 530 may be integrally formed over the organic light-emitting diodes OLED and thus may correspond to the pixel electrodes 510. The opposite electrode 530 may include a light-transmissive conductive layer including ITO, $In_2O_3$, or IZO and also include a semi-transmissive layer including metal, such as Al or Ag. In an embodiment, for example, the opposite electrode 530 may be a semi-transmissive layer including MgAg.

In the first peripheral area PA1, a connection line 710 may be disposed above the second organic insulating layer 109. The connection line 710 may be a bridge line for electrically connecting the power line 610 to the organic light-emitting diode OLED or the thin-film transistor TFT which is in the display area DA. The connection line 710 may include the same material as the pixel electrode 510. In an embodiment, for example, when the pixel electrode 510 includes a stack structure of ITO/Ag/ITO, the connection line 710 may also have the stack structure.

The connection line 710 may contact the power line 610 through a second contact hole CNT2 penetrating the second organic insulating layer 109 and the second inorganic insulating layer 108. The second contact hole CNT2 may be defined by the second inorganic insulating layer 108 and the second organic insulating layer 109.

In the display area DA, a pixel-defining layer PDL may be disposed above the second organic insulating layer 109. The pixel-defining layer PDL may define emission areas of the pixels by including an opening corresponding to each pixel, that is, an opening exposing at least a portion of the pixel electrode 510. Also, the pixel-defining layer PDL prevents arcs, etc. from being generated at the edges of the pixel electrode 510 by increasing the distance between the edges of the pixel electrode 510 and the opposite electrode 530. The pixel-defining layer PDL may include an organic insulating material, such as polyimide, polyamide, acrylic resin, BCB, HMDSO, or phenol resin, and may be formed through spin coating or the like.

Because the organic light-emitting diode OLED described may be easily damaged by external moisture or oxygen, an encapsulation layer (not shown) may be arranged to cover the organic light-emitting diode OLED. The encapsulation layer (not shown) may include at least one inorganic encapsulation layer and at least one organic encapsulation layer. The encapsulation layer (not shown) may cover the display area DA and extend to part of the first peripheral area PA1 and the second peripheral area PA2 outside the display area DA.

In the display apparatus according to an embodiment, the power line 610 and the pad PAD are formed at a different layer from the first source-drain electrode 310 and the second source-drain electrode 320, and thus, a high-resolution pixel arrangement may be possible.

Figure 5:
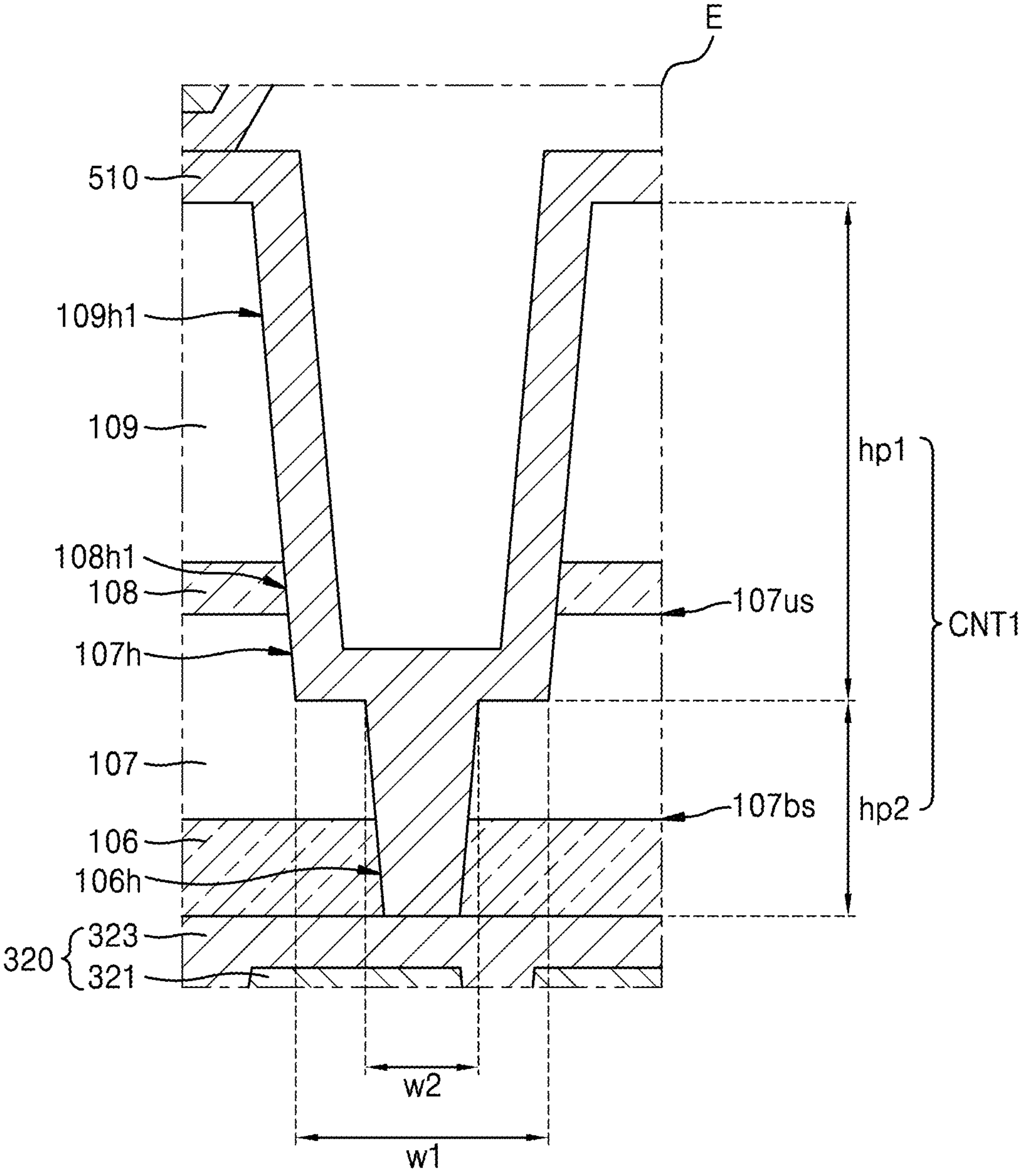
FIG. 5 is a schematic cross-sectional view of enlarged region E of the display apparatus of FIG. 4B.

FIG. 5 is a schematic cross-sectional view of enlarged region E of the display apparatus of FIG. 4B.

Referring to FIG. 5, the pixel electrode 510 may contact an upper surface of the second source-drain electrode 320 through the first contact hole CNT1 penetrating the second organic insulating layer 109, the second inorganic insulating layer 108, the first organic insulating layer 107, and the first inorganic insulating layer 106. The second source-drain electrode 320 may include the third sub-layer 321 and the fourth sub-layer 323, and the pixel electrode 510 may contact the fourth sub-layer 323.

The first contact hole CNT1 may include a first sub-hole 106*h*, a second sub-hole 107*h*, a third sub-hole 108*h*1, and a fourth sub-hole 109*h*1, which overlap each other. The first sub-hole 106*h* may be defined by the first inorganic insulating layer 106, the second sub-hole 107*h* may be defined by the first organic insulating layer 107, the third sub-hole 108*h*1 may be defined by the second inorganic insulating layer 108, and the fourth sub-hole 109*h*1 may be defined by the second organic insulating layer 109.

The first contact hole CNT1 may include a first portion hp1, which is defined by the second organic insulating layer 109, the second inorganic insulating layer 108, and an upper portion of the first organic insulating layer 107, and a second portion hp2, which is defined by a lower portion of the first organic insulating layer 107 and the first inorganic insulating layer 106. The upper portion of the first organic insulating layer 107 may be adjacent to an upper surface 107*us* of the first organic insulating layer 107, on which the first organic insulating layer 107 contacts the second inorganic insulating layer 108, and the lower portion of the first organic insulating layer 107 may be adjacent to a bottom surface 107*bs* of the first organic insulating layer 107, on which the first organic insulating layer 107 contacts the first inorganic insulating layer 106.

The width of the first portion hp1 of the first contact hole CNT1 may be different from the width of the second portion hp2 of the first contact hole CNT1 in a plan view. In an embodiment, for example, the width of the first portion hp1 of the first contact hole CNT1 may be greater than the width of the second portion hp2 of the first contact hole CNT1. At a border between the first portion hp1 and the second portion hp2, the first portion hp1 may have a first width w1, and the second portion hp2 may have a second width w2 that is less than the first width w1 in a plan view. The width of the first contact hole CNT1 may decrease in a direction from top to the bottom of the first contact hole CNT1. The point (i.e., the border between the first portion hp1 and the second portion hp2) where the first contact hole CNT1 may have the width that discontinuously changes may be located between the upper surface 107*us* and the bottom surface 107*bs* of the first organic insulating layer 107.

In an embodiment, a thickness of the lower portion of the first organic insulating layer 107 may be greater than a thickness of the upper portion of the first organic insulating layer 107, for example, the thickness of the lower portion is 4 times or more of the thickness of the upper portion.

Figure 10A:
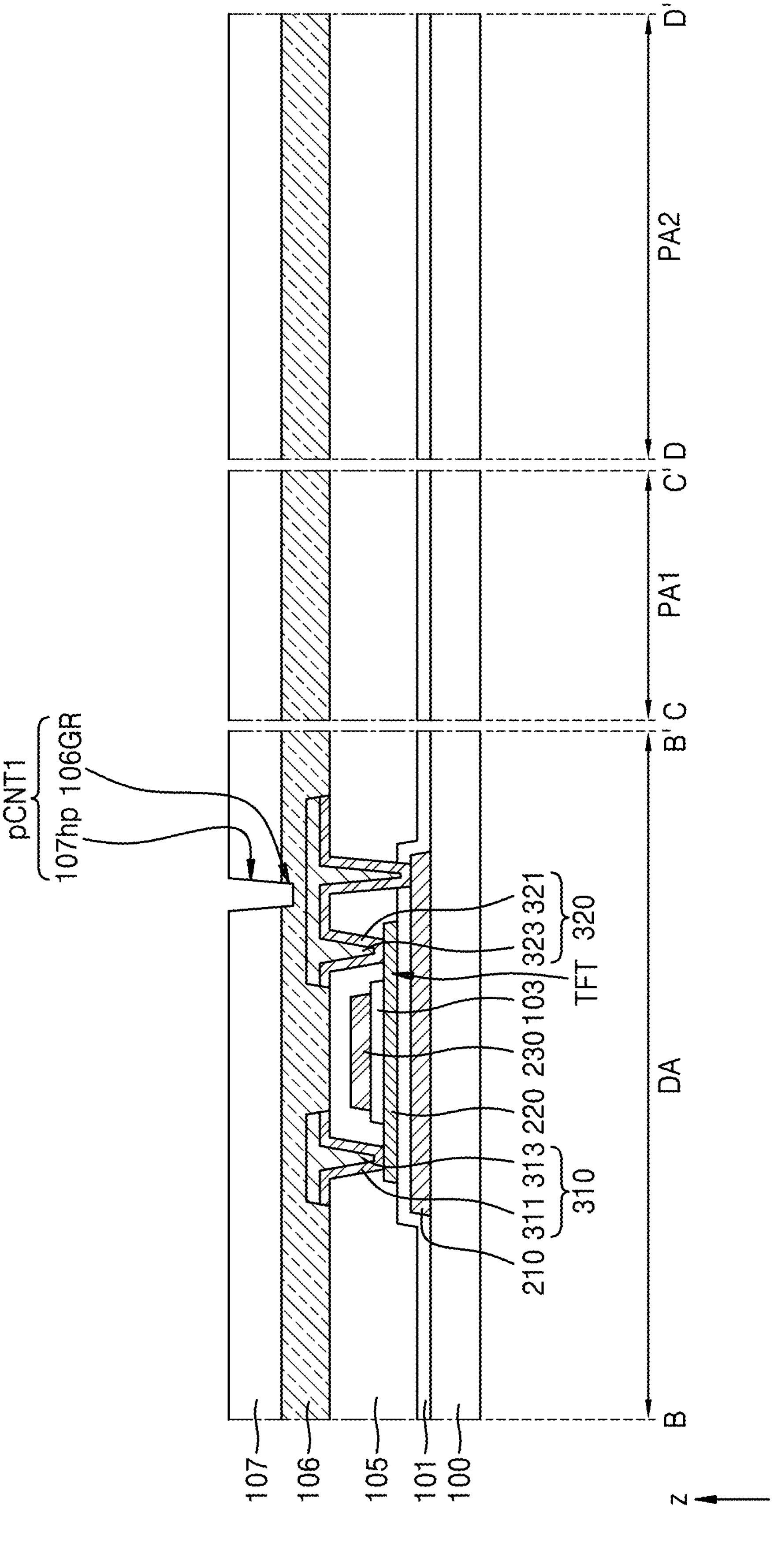
FIGS. 10A to 10F are schematic cross-sectional views of processes of manufacturing the display apparatus of FIG. 4B.
Figure 10B:
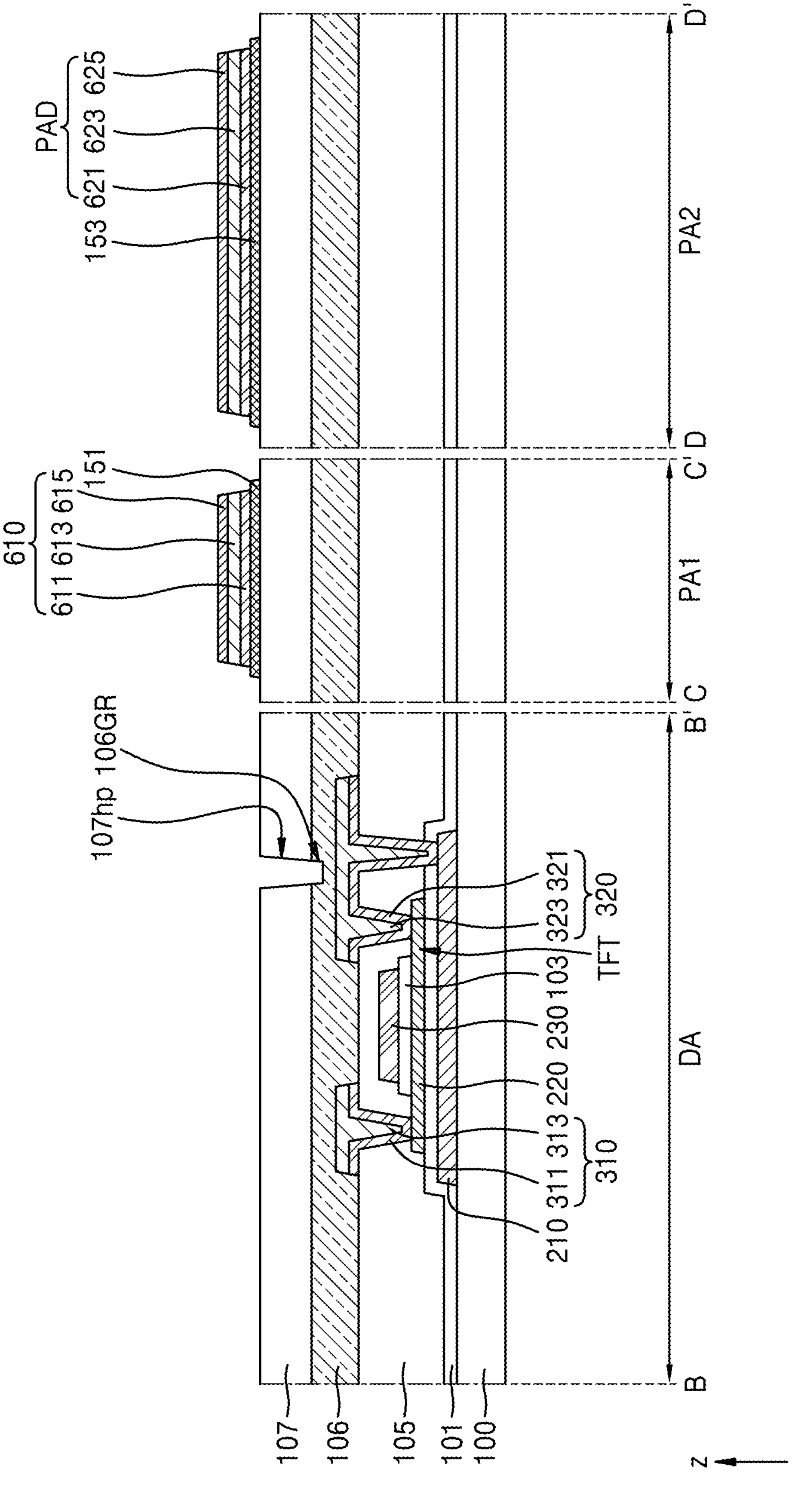
Figure 10C:
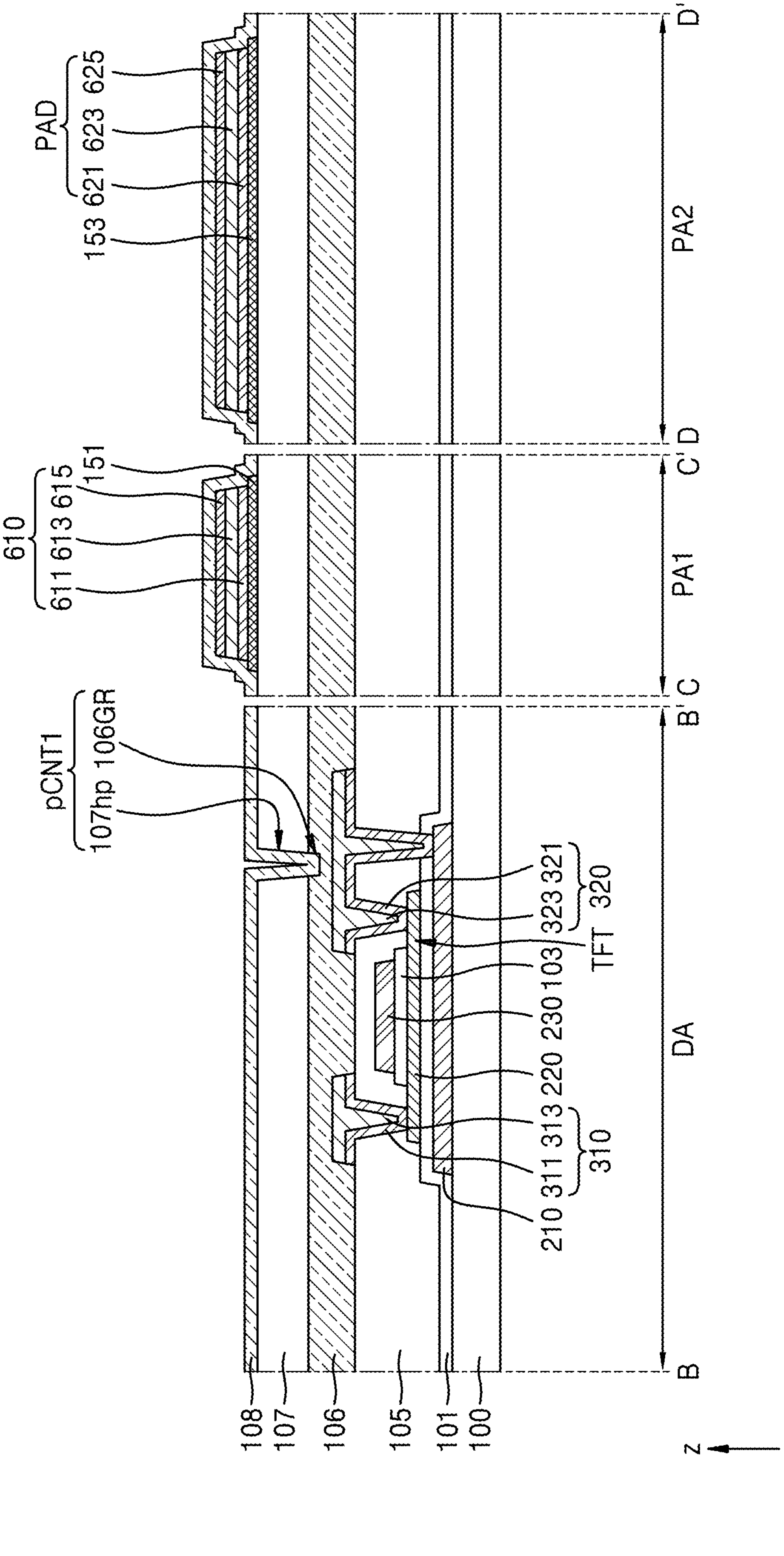
Figure 10D:
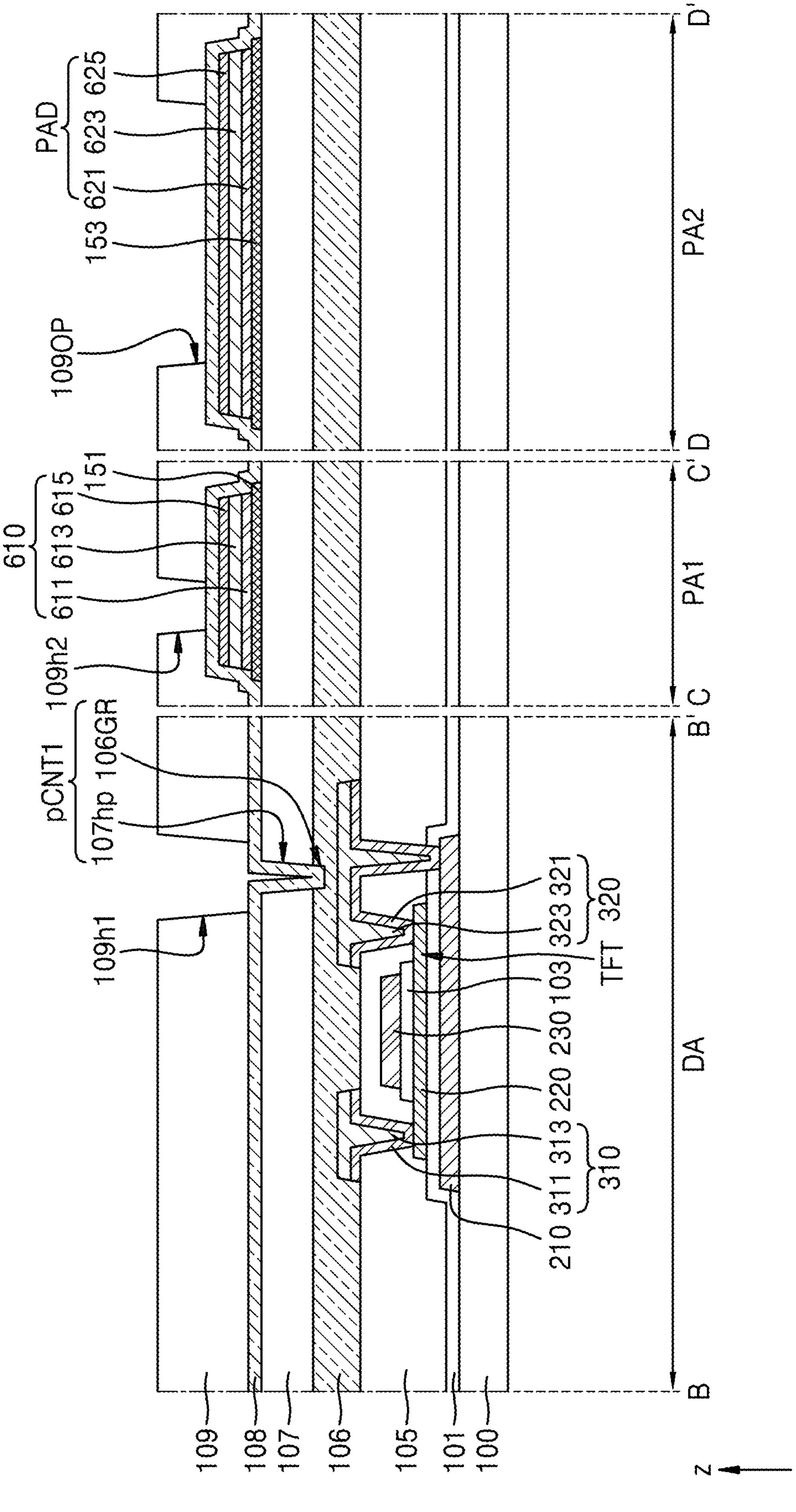
Figure 10E:
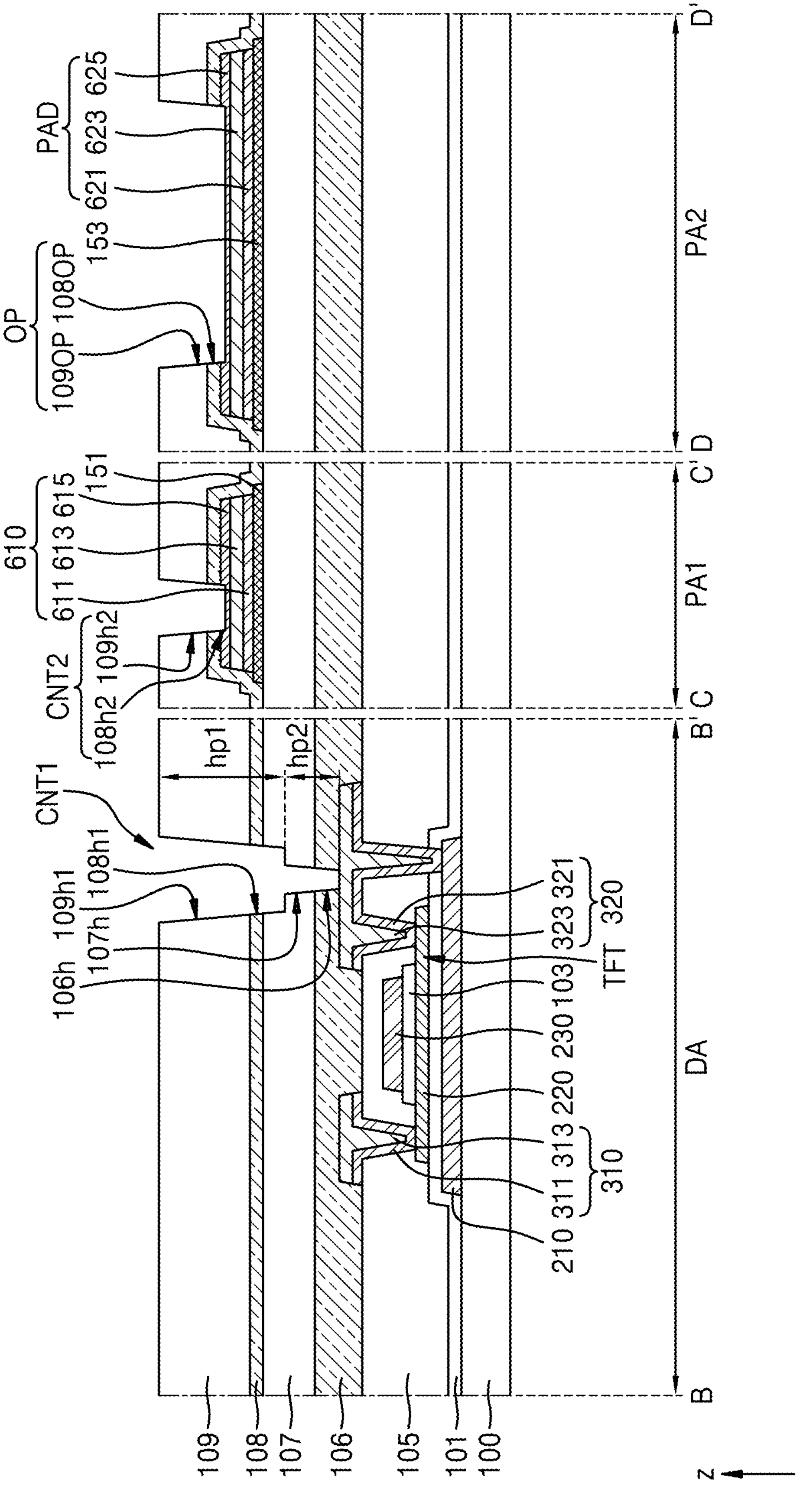

The first contact hole CNT1 may be formed through a first etching process of etching the first organic insulating layer 107 and a portion (i.e., upper portion) of the first inorganic insulating layer 106 (See FIG. 10A), a second etching process of etching the second organic insulating layer 109 (See FIG. 10D), and a third etching process of the second inorganic insulating layer 108 and remaining portions (i.e., the lower portion) of the first inorganic insulating layer 106 (See FIG. 10E). As at least a portion (i.e., lower portion) of the first inorganic insulating layer 106 is etched together with the second inorganic insulating layer 108 in a process of forming the first contact hole CNT1, the damage to the upper surface of the second source-drain electrode 320 may be effectively prevented or reduced, where the damage is caused during the manufacture of the display apparatus.

Figure 6:
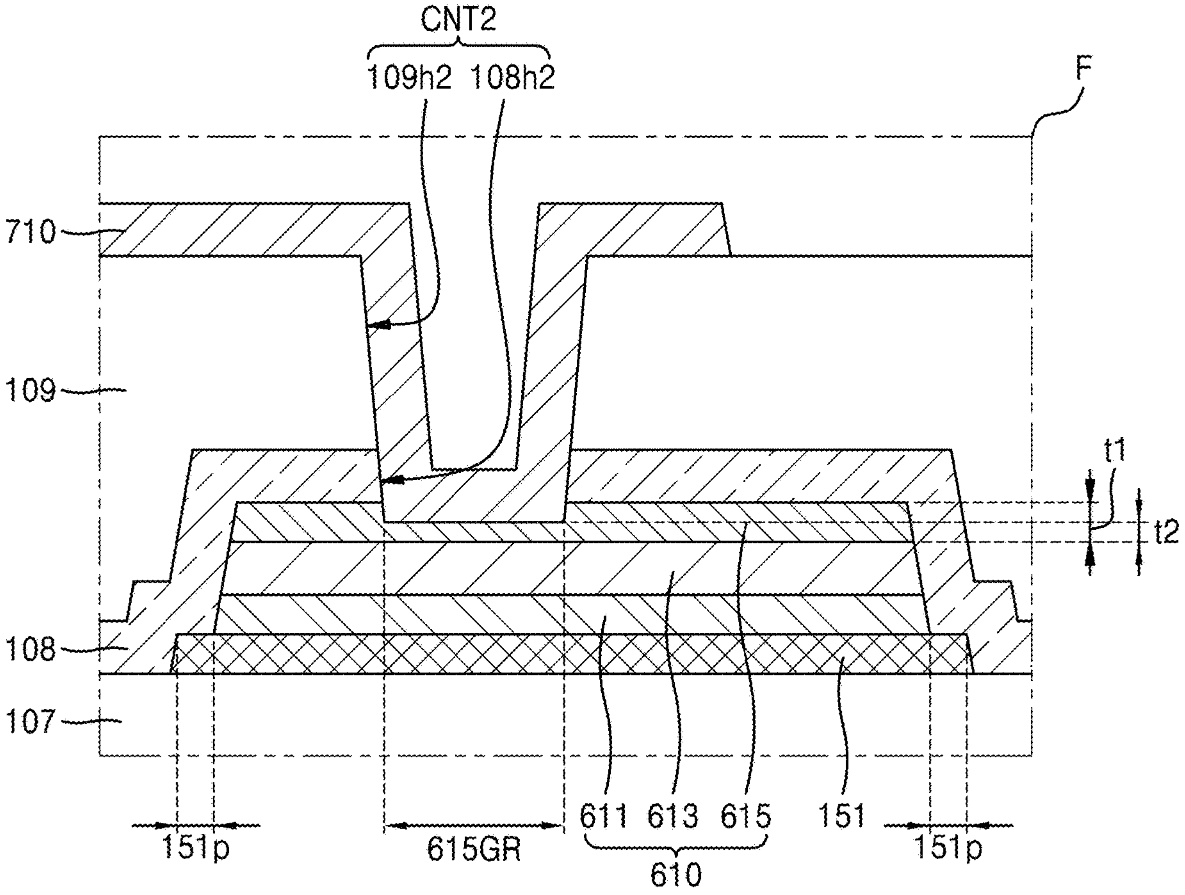
FIG. 6 is a schematic cross-sectional view of enlarged region F of the display apparatus of FIGS. 4A and 4B.

FIG. 6 is a schematic cross-sectional view of enlarged region F of the display apparatus of FIGS. 4A and 4B.

Referring to FIG. 6, the power line 610 may be disposed above the first organic insulating layer 107. The power line 610 may include the first conductive layer 611 and the third conductive layer 615 which include different conductive materials. The first conductive layer 611 and the second conductive layer 613 may have different metal materials. In an embodiment, for example, the first conductive layer 611 may include Ti, and the second conductive layer 613 may include Al or Cu. In an embodiment, the power line 610 may further include the third conductive layer 615 disposed above the second conductive layer 613. In an embodiment, for example, when the power line 610 is disposed in the same layer as the pad (PAD, see FIG. 4A), the power line 610 may have a three-layer structure including the first conductive layer 611, the second conductive layer 613, and the third conductive layer 615. The third conductive layer 615 may include metal oxide. The metal oxide may include ITO.

The first protective layer 151 may be disposed between the power line 610 and the first organic insulating layer 107. The first protective layer 151 may include an inorganic insulating material, such as silicon oxide, silicon nitride, and/or silicon oxynitride. The first protective layer 151 may be formed through CVD.

Because the power line 610 is formed together with the first protective layer 151 through the same mask process (a patterning process), the shape of the first protective layer 151 may correspond to the shape of the power line 610 in a plan view. In an embodiment, a portion 151*p* of the first protective layer 151 may protrude towards the outside of the power line 610 because of a difference in the etch rates of the first protective layer 151 and the power line 610.

The second inorganic insulating layer 108 may be disposed above the power line 610. The second inorganic insulating layer 108 may include an inorganic insulating material, such as silicon oxide, silicon nitride, and/or silicon oxynitride. The second inorganic insulating layer 108 may cover upper and side surfaces of the power line 610 and prevent the first conductive layer 611, the second conductive layer 613, and the third conductive layer 615 from directly contacting the second organic insulating layer 109.

The second organic insulating layer 109 may be disposed above the second inorganic insulating layer 108. The second organic insulating layer 109 may provide a flat upper surface by burying uneven portions formed due to a lower structure. The second organic insulating layer 109 may include an organic insulating material.

The second inorganic insulating layer 108 may directly contact the portion 151$p$ of the first protective layer 151. The upper, lower, and side surfaces of the power line 610 may be separated from the first organic insulating layer 107 and the second organic insulating layer 109 by the first protective layer 151 and the second inorganic insulating layer 108. Therefore, the damage to the power line 610 may be effectively prevented or reduced, where the damage is caused by gases, etc. which are generated from the first organic insulating layer 107 and the second organic insulating layer 109 during the manufacture of the display apparatus.

The connection line 710 may be disposed above the second organic insulating layer 109. The connection line 710 may be a bridge line for electrically connecting the power line 610 to the organic light-emitting diode OLED or the thin-film transistor TFT which is in the display area DA.

The connection line 710 may contact the power line 610 through the second contact hole CNT2 penetrating the second inorganic insulating layer 108 and the second organic insulating layer 109. The second contact hole CNT2 may include a fifth sub-hole 108$h$2 and a sixth sub-hole 109$h$2. The fifth sub-hole 108$h$2 may be defined by the second inorganic insulating layer 108, and the sixth sub-hole 109$h$2 may be defined by the second organic insulating layer 109.

The third conductive layer 615 of the power line 610 may define a first groove 615GR. The first groove 615GR may overlap the second contact hole CNT2. In an embodiment, for example, the first groove 615GR may be formed as a portion of the third conductive layer 615 is etched in the process of forming the second contact hole CNT2. Therefore, the third conductive layer 615 of the power line 610 may have a thickness that is less than the thickness of a peripheral area, in an area where the third conductive layer 615 contacts the second contact hole CNT2. In an embodiment, for example, the third conductive layer 615 of the power line 610 may have a first thickness t1 on an outer side of the first groove 615GR and a second thickness t2 on an inner side of the first groove 615GR. In this case, the second thickness t2 may be less than the first thickness t1.

Figure 7:
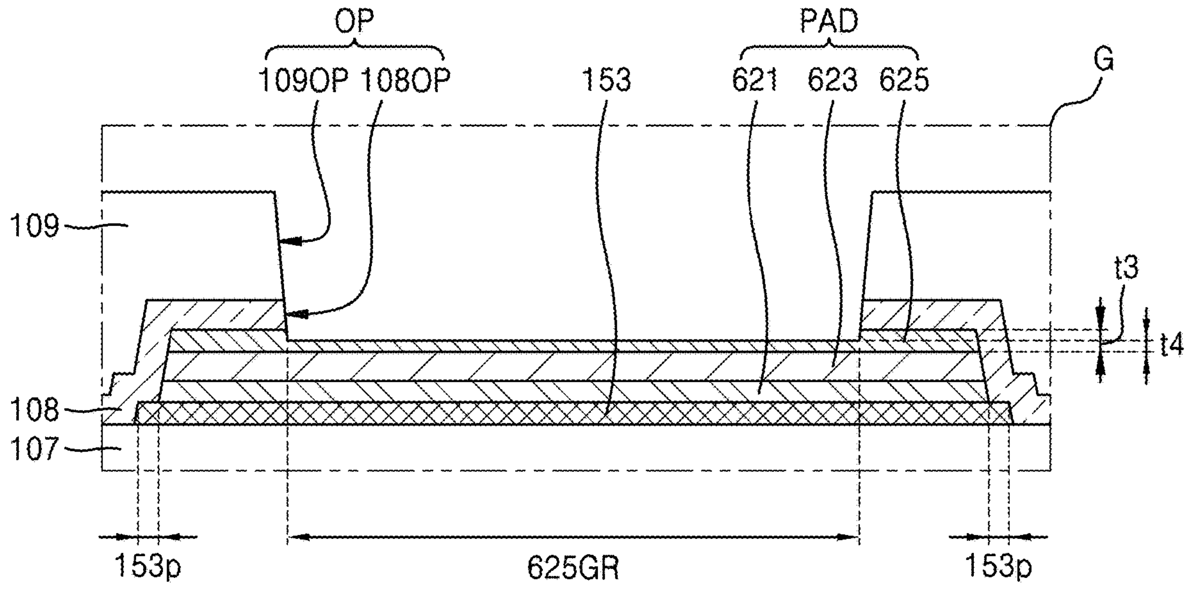
FIG. 7 is a schematic cross-sectional view of enlarged region G of the display apparatus of FIGS. 4A and 4B.

FIG. 7 is a schematic cross-sectional view of enlarged region G of the display apparatus of FIGS. 4A and 4B.

Referring to FIG. 7, the pad PAD may be disposed above the first organic insulating layer 107. The pad PAD may include the fourth conductive layer 621, the fifth conductive layer 623, and the sixth conductive layer 625 which include different conductive materials. The fourth conductive layer 621 and the fifth conductive layer 623 may have different metal materials. In an embodiment, for example, the fourth conductive layer 621 may include Ti, and the fifth conductive layer 623 may include Al or Cu. The sixth conductive layer 625 may include metal oxide. The metal oxide may include ITO.

The second protective layer 153 may be disposed between the pad PAD and the first organic insulating layer 107. The second protective layer 153 may include an inorganic insulating material, such as silicon oxide, silicon nitride, and/or silicon oxynitride. The second protective layer 153 may be formed through CVD.

Because the pad PAD is formed together with the second protective layer 153 through the same mask process (the patterning process), the shape of the second protective layer 153 may correspond to the shape of the pad PAD when viewed in a plan view. In an embodiment, a portion 153$p$ of the second protective layer 153 may protrude towards the outside of the pad PAD because of a difference in the etch rates of the second protective layer 153 and the pad PAD.

The second inorganic insulating layer 108 may be disposed above the pad PAD. The second inorganic insulating layer 108 may include an inorganic insulating material, such as silicon oxide, silicon nitride, and/or silicon oxynitride. The second inorganic insulating layer 108 may cover the upper and side surfaces of the pad PAD and prevent the fourth conductive layer 621, the fifth conductive layer 623, and the sixth conductive layer 625 from directly contacting the second organic insulating layer 109.

The second organic insulating layer 109 may be disposed above the second inorganic insulating layer 108. The second organic insulating layer 109 may provide a flat upper surface by burying uneven portions formed due to a lower structure. The second organic insulating layer 109 may include an organic insulating material.

The opening OP may be arranged, wherein the opening OP overlaps the pad PAD and exposes the upper surface of the pad PAD from the second inorganic insulating layer 108 and the second organic insulating layer 109. The opening OP may include a first sub-opening 108OP and a second sub-opening 109OP which overlap each other. The first sub-opening 108OP may be defined by the second inorganic insulating layer 108, and the second sub-opening 109OP may be defined by the second organic insulating layer 109. The pad PAD may be electrically connected to the integrated circuit device and/or the printed circuit board through the opening OP.

The sixth conductive layer 625 of the pad PAD may define a second groove 625GR. The second groove 625GR may overlap the opening OP. In an embodiment, for example, the second groove 625GR may be formed as a portion of the sixth conductive layer 625 is etched in the process of forming the opening OP. Therefore, the sixth conductive layer 625 of the pad PAD may have a thickness that is less than the thickness of the peripheral area, in an area where the sixth conductive layer 625 overlaps the opening OP. In an embodiment, for example, the sixth conductive layer 625 of the pad PAD may have a third thickness t3 on an outer side of the second groove 625GR and a fourth thickness t4 on an inner side of the second groove 625GR. In this case, the fourth thickness t4 may be less than the third thickness t3.

The second inorganic insulating layer 108 may directly contact the portion 153$p$ of the second protective layer 153. The upper, lower, and side surfaces of the pad PAD may be separated from the first organic insulating layer 107 and the second organic insulating layer 109 by the second protective layer 153 and the second inorganic insulating layer 108. Therefore, the damage to the pad PAD may be effectively prevented or reduced, where the damage is caused by gases, etc. which are generated from the first organic insulating layer 107 and the second organic insulating layer 109 during the manufacture of the display apparatus.

Figure 8:
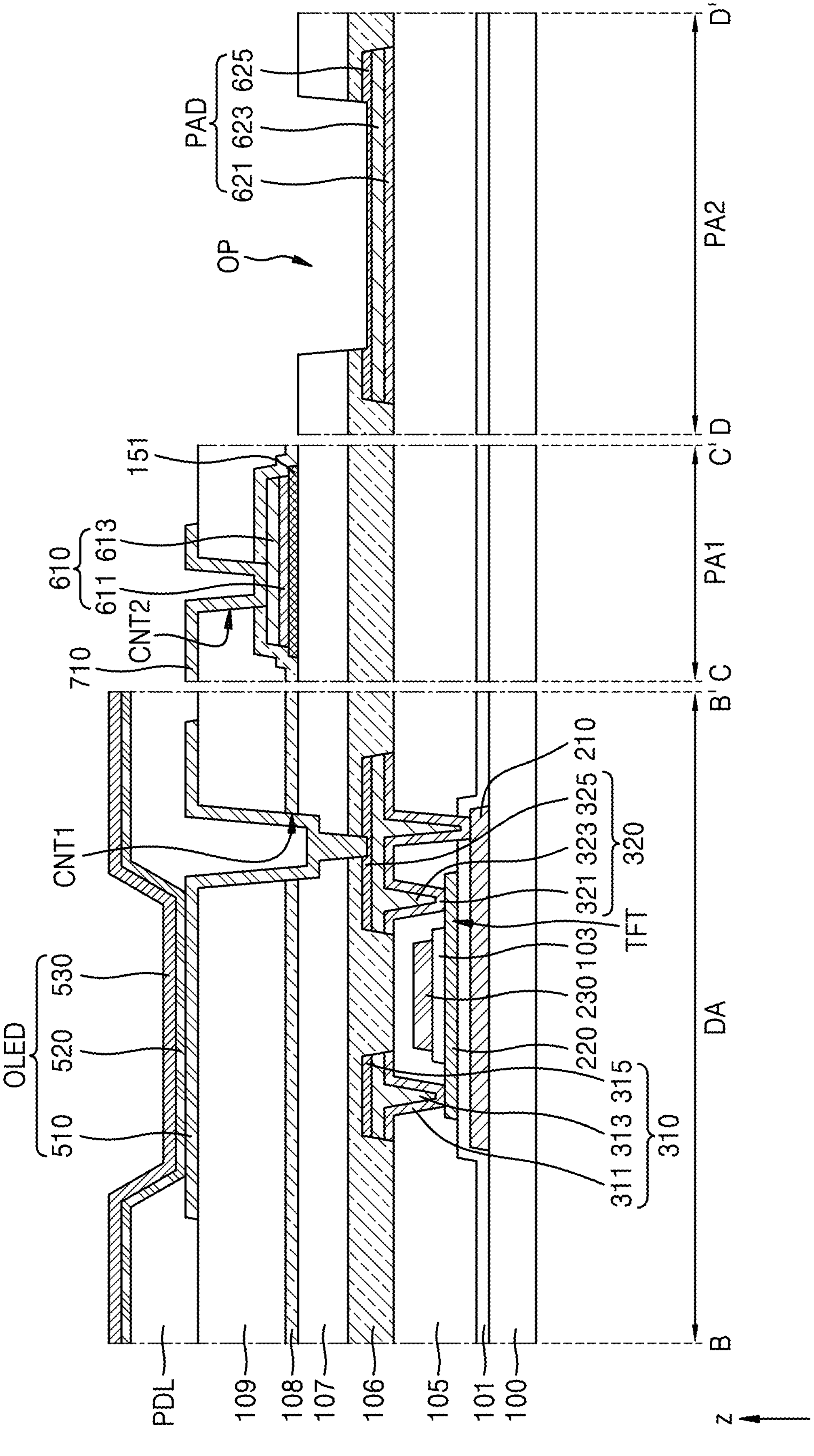
FIG. 8 is a schematic cross-sectional view of a display apparatus according to another embodiment.

FIG. 8 is a schematic cross-sectional view of a display apparatus according to another embodiment. The display apparatus of FIG. 8 is similar to the display apparatus of FIG. 4B, but is different therefrom in that the pad PAD is in the same layer as the first source-drain electrode 310 and the second source-drain electrode 320. Hereinafter, descriptions regarding components that are the same as or similar to those already given are omitted, and a difference is mainly described.

Referring to FIG. 8, in the display area DA, the organic light-emitting diode OLED and the thin-film transistor TFT electrically connected to the organic light-emitting diode OLED may be disposed above the substrate 100. The thin-film transistor TFT may include the semiconductor layer 220, the gate electrode 230, the first source-drain electrode 310, and the second source-drain electrode 320.

In the display area DA, the first source-drain electrode 310 and the second source-drain electrode 320 may be disposed above the interlayer-insulating layer 105. In an embodiment, the semiconductor layer 220 of the thin-film transistor TFT may be connected to a semiconductor layer 220 of another adjacent thin-film transistor TFT, and any one of the first source-drain electrode 310 and the second source-drain electrode 320 may be omitted.

The first source-drain electrode 310 and the second source-drain electrode 320 may each have a multilayered structure. The first source-drain electrode 310 may include the first sub-layer 311, the second sub-layer 313, and a fifth sub-layer 315, and the second source-drain electrode 320 may include the third sub-layer 321, the fourth sub-layer 323, and a sixth sub-layer 325. The first sub-layer 311 may include the same material as the third sub-layer 321. In an embodiment, the first sub-layer 311 and the third sub-layer 321 may each include Ti. The second sub-layer 313 may include the same material as the fourth sub-layer 323. In an embodiment, the second sub-layer 313 and the fourth sub-layer 323 may each include Al or Cu. The fifth sub-layer 315 may include the same material as the sixth sub-layer 325. In an embodiment, the fifth sub-layer 315 and the sixth sub-layer 325 may each include metal oxide. In an embodiment, for example, the metal oxide may include ITO.

In the second peripheral area PA2, the pad PAD may be disposed above the interlayer-insulating layer 105. The pad PAD may include the fourth conductive layer 621, the fifth conductive layer 623, and the sixth conductive layer 625 which are sequentially stacked. The fourth conductive layer 621, the fifth conductive layer 623, and the sixth conductive layer 625 may include different materials. The fourth conductive layer 621 may include Ti, the fifth conductive layer 623 may include Al or Cu, and the sixth conductive layer 625 may include metal oxide. Here, the metal oxide may include ITO.

In an embodiment, the fourth conductive layer 621 may include the same material as the first sub-layer 311 and the third sub-layer 321, the fifth conductive layer 623 may include the same material as the second sub-layer 313 and the fourth sub-layer 323, and the sixth conductive layer 625 may include the same material as the fifth sub-layer 315 and the sixth sub-layer 325.

The first inorganic insulating layer 106 may be disposed to cover the first source-drain electrode 310, the second source-drain electrode 320, and the pad PAD. The first inorganic insulating layer 106 may include silicon oxide, silicon nitride, and/or silicon oxynitride.

The first organic insulating layer 107 may be disposed above the first inorganic insulating layer 106. The first organic insulating layer 107 may function as a planarization layer to provide a flat upper surface by burying uneven portions formed because of the thin-film transistor TFT. The first organic insulating layer 107 may include an organic insulating material.

The first inorganic insulating layer 106 may effectively prevent or reduce the damage to the first source-drain electrode 310, the second source-drain electrode 320, and the pad PAD, where the damage is caused by gases, etc. generated from the first organic insulating layer 107 during the manufacturing of the display apparatus.

In the second peripheral area PA2, the opening OP may be arranged to overlap the pad PAD. The opening OP may be defined by the first inorganic insulating layer 106 and the first organic insulating layer 107 to expose the upper surface of the pad PAD. As described above with reference to FIG. 7, the sixth conductive layer 625 of the pad PAD may define the second groove 625GR that is formed as a portion of the sixth conductive layer 625 is etched during the process of forming the opening OP.

In the first peripheral area PA1, the power line 610 may be disposed above the first organic insulating layer 107. As described above, the power line 610 may be the common power voltage (ELVSS, see FIG. 2) supply line or the driving power voltage (ELVDD, see FIG. 2) supply line.

The power line 610 may include the first conductive layer 611 and the second conductive layer 613 which are sequentially stacked. The first conductive layer 611 and the second conductive layer 613 may have different conductive materials. The first conductive layer 611 may include Ti, and the second conductive layer 613 may include Al and/or Cu.

The first protective layer 151 may be disposed between the power line 610 and the first organic insulating layer 107. The first protective layer 151 may include an inorganic insulating material, such as silicon oxide, silicon nitride, and/or silicon oxynitride. The first protective layer 151 may be formed through CVD.

In a plan view, the shape of the first protective layer 151 may correspond to the shape of the power line 610. In other words, the first protective layer 151 may be patterned together with the power line 610 through the same mask process.

The second inorganic insulating layer 108 may be disposed above the first organic insulating layer 107 to cover the power line 610. The second inorganic insulating layer 108 may include silicon oxide, silicon nitride, and/or silicon oxynitride.

The second organic insulating layer 109 may be disposed above the second inorganic insulating layer 108. The second organic insulating layer 109 may function as a planarization layer to provide a flat upper surface to the organic light-emitting diode OLED. The second organic insulating layer 109 may include an organic insulating material.

In an embodiment, the second inorganic insulating layer 108 may directly contact the first protective layer 151. In an embodiment, for example, the power line 610 may be separated from the first organic insulating layer 107 and the second organic insulating layer 109 by the first protective layer 151 and the second inorganic insulating layer 108.

In the display area DA, the organic light-emitting diode OLED may be disposed above the second organic insulating layer 109. The organic light-emitting diode OLED may include, for example, the pixel electrode 510, the opposite electrode 530, and the intermediate layer 520 arranged therebetween and including an emission layer.

The pixel electrode 510 may contact the second source-drain electrode 320 through the first contact hole CNT1 penetrating the second organic insulating layer 109, the second inorganic insulating layer 108, the first organic insulating layer 107, and the first inorganic insulating layer 106 and may be electrically connected to the thin-film transistor TFT. In other words, the first contact hole CNT1 may be defined by the first inorganic insulating layer 106, the first organic insulating layer 107, the second inorganic insulating layer 108, and the second organic insulating layer 109.

As described above with reference to FIG. 5, the first contact hole CNT1 may have a step in which the width of the first contact hole CNT1 discontinuously changes in the first organic insulating layer 107 in a plan view. That is, the first contact hole CNT1 may include the first portion (hp1, see FIG. 5), which is defined by the second organic insulating layer 109, the second inorganic insulating layer 108, and the upper portion of the first organic insulating layer 107, and the second portion (hp2, see FIG. 5), which is defined by the lower portion of the first organic insulating layer 107 and the first inorganic insulating layer 106. The width of the first portion (hp1, see FIG. 5) of the first contact hole CNT1 may be different from the width of the second portion (hp2, see FIG. 5) of the first contact hole CNT1. In an embodiment, for example, the width of the first portion (hp1, see FIG. 5) of the first contact hole CNT1 may be greater than the width of the second portion (hp2, see FIG. 5) of the first contact hole CNT1 in a plan view.

In the first peripheral area PA1, a connection line 710 may be disposed above the second organic insulating layer 109. The connection line 710 may be a bridge line for electrically connecting the power line 610 to the organic light-emitting diode OLED or the thin-film transistor TFT which is in the display area DA. The connection line 710 may include the same material as the pixel electrode 510. In an embodiment, for example, when the pixel electrode 510 has a stack structure of ITO/Ag/ITO, the connection line 710 may also have the stack structure.

The connection line 710 may contact the power line 610 through the second contact hole CNT2 penetrating the second organic insulating layer 109 and the second inorganic insulating layer 108. The second contact hole CNT2 may be defined by the second inorganic insulating layer 108 and the second organic insulating layer 109.

In the display area DA, the pixel-defining layer PDL may be disposed above the second organic insulating layer 109. An encapsulation layer (not shown) may be disposed to cover the organic light-emitting diode OLED. The encapsulation layer (not shown) may include at least one inorganic encapsulation layer and at least one organic encapsulation layer. The encapsulation layer (not shown) may cover the display area DA and extend to part of the first peripheral area PA1 and the second peripheral area PA2 outside the display area DA.

Figure 9:
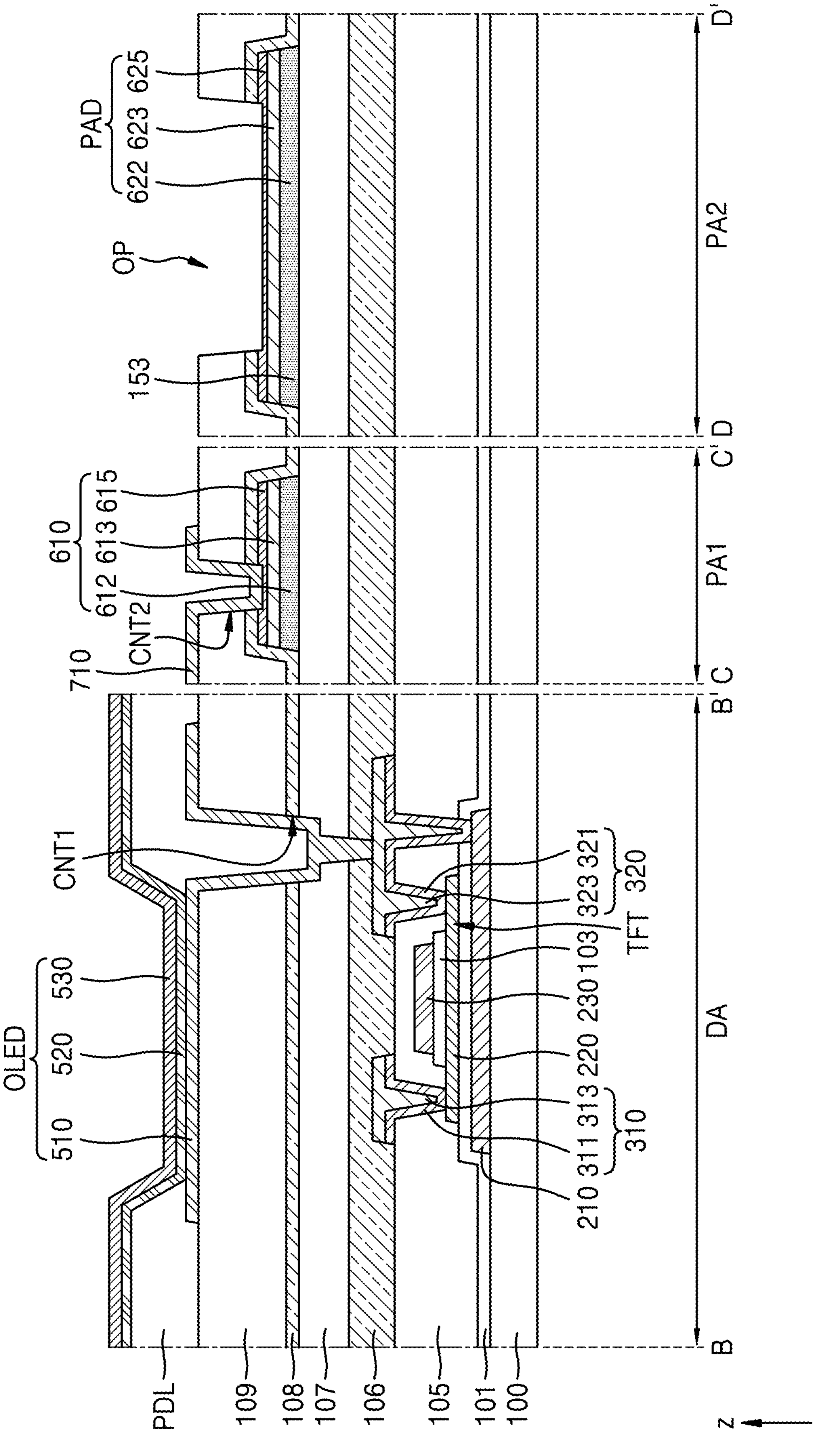
FIG. 9 is a schematic cross-sectional view of a display apparatus according to still another embodiment.

FIG. 9 is a schematic cross-sectional view of a display apparatus according to another embodiment. The display apparatus of FIG. 9 is similar to the display apparatus of FIG. 4B, but is different therefrom in that the power line 610 includes a MoTi layer instead of the first conductive layer (611, see FIG. 4B). Hereinafter, descriptions regarding components that are the same as or similar to those already given are omitted, and a difference is mainly described.

Referring to FIG. 8, in the display area DA, the organic light-emitting diode OLED and the thin-film transistor TFT electrically connected to the organic light-emitting diode OLED may be disposed above the substrate 100. The thin-film transistor TFT may include the semiconductor layer 220, the gate electrode 230, the first source-drain electrode 310, and the second source-drain electrode 320.

In the display area DA, the first source-drain electrode 310 and the second source-drain electrode 320 may be disposed above the interlayer-insulating layer 105. In an embodiment, the semiconductor layer 220 of the thin-film transistor TFT may be connected to a semiconductor layer 220 of another adjacent thin-film transistor TFT, and any one of the first source-drain electrode 310 and the second source-drain electrode 320 may be omitted.

The first inorganic insulating layer 106 may be disposed to cover the first source-drain electrode 310 and the second source-drain electrode 320. The first inorganic insulating layer 106 may include silicon oxide, silicon nitride, and/or silicon oxynitride.

The first organic insulating layer 107 may be disposed above the first inorganic insulating layer 106. The first organic insulating layer 107 may function as a planarization layer to provide a flat upper surface by burying uneven portions formed because of the thin-film transistor TFT. The first organic insulating layer 107 may include an organic insulating material.

In the first peripheral area PA1, the power line 610 may be disposed above the first organic insulating layer 107. As described above, the power line 610 may be the common power voltage (ELVSS, see FIG. 2) supply line or the driving power voltage (ELVDD, see FIG. 2) supply line.

The power line 610 may include a first molybdenum titanium (MoTi) layer 612 and the second conductive layer 613 which are sequentially stacked. The first MoTi layer 612 may include MoTi. The second conductive layer 613 may include Al and/or Cu. The shape of the first MoTi layer 612 may correspond to the shape of the second conductive layer 613.

MoTi does not generate oxide, such as titanium oxide, even when heated at a temperature of 350° C. or higher. Therefore, the first MoTi layer 612 may effectively prevent or reduce the damage to the power line 610, where the damage is caused by gases, etc. generated from the first organic insulating layer 107 during the manufacture of the display apparatus.

In an embodiment, the power line 610 may include the third conductive layer 615. The third conductive layer 615 may include metal oxide. In an embodiment, for example, the metal oxide may include ITO.

In the second peripheral area PA2, the pad PAD may be disposed above the first organic insulating layer 107. The pad PAD may include a second molybdenum titanium (MoTi) layer 622, the fifth conductive layer 623, and the sixth conductive layer 625 which are sequentially stacked. The second MoTi layer 622 may include MoTi. The fifth conductive layer 623 may include Al or Cu, and the sixth conductive layer 625 may include metal oxide. Here, the metal oxide may include ITO. The shape of the second MoTi layer 622 may correspond to the shape of the fifth conductive layer 623 and the shape of the sixth conductive layer 625.

The second MoTi layer 622 may effectively prevent or reduce the damage to the pad PAD, where the damage is caused by gases, etc. generated from the first organic insulating layer 107 during the manufacture of the display apparatus.

In an embodiment, the second MoTi layer 622 may include the same material as the first MoTi layer 612. As described, the fifth conductive layer 623 may include the same material as the fourth conductive layer 621, and the sixth conductive layer 625 may include the same material as the third conductive layer 615.

The second inorganic insulating layer 108 may be disposed above the first organic insulating layer 107 to cover the power line 610 and the pad PAD. The second inorganic insulating layer 108 may include silicon oxide, silicon nitride, and/or silicon oxynitride.

The second organic insulating layer 109 may be disposed above the second inorganic insulating layer 108. The second organic insulating layer 109 may function as a planarization layer to provide a flat upper surface to the organic light-emitting diode OLED. The second organic insulating layer 109 may include an organic insulating material.

In an embodiment, the second inorganic insulating layer 108 may directly contact the first MoTi layer 612 and the second MoTi layer 622. Therefore, the second conductive layer 613 and the third conductive layer 615 of the power line 610 may be separated from the first organic insulating layer 107 and the second organic insulating layer 109 by the first MoTi layer 612 and the second inorganic insulating layer 108. As described, the fifth conductive layer 623 and the sixth conductive layer 625 of the pad PAD may be separated from the first organic insulating layer 107 and the second organic insulating layer 109 by the second MoTi layer 622 and the second inorganic insulating layer 108.

The opening OP may be arranged, wherein the opening OP overlaps the pad PAD and exposes the upper surface of the pad PAD from the second inorganic insulating layer 108 and the second organic insulating layer 109. The opening OP may be defined by the second inorganic insulating layer 108 and the second organic insulating layer 109. The pad PAD may be electrically connected to the integrated circuit device and/or the printed circuit board through the opening OP.

In the display area DA, the organic light-emitting diode OLED may be disposed above the second organic insulating layer 109. The organic light-emitting diode OLED may include, for example, the pixel electrode 510, the opposite electrode 530, and the intermediate layer 520 arranged therebetween and including an emission layer.

The pixel electrode 510 may contact the second source-drain electrode 320 through the first contact hole CNT1 penetrating the second organic insulating layer 109, the second inorganic insulating layer 108, the first organic insulating layer 107, and the first inorganic insulating layer 106 and may be electrically connected to the thin-film transistor TFT. In other words, the first contact hole CNT1 may be defined by the first inorganic insulating layer 106, the first organic insulating layer 107, the second inorganic insulating layer 108, and the second organic insulating layer 109.

As described above with reference to FIG. 5, the first contact hole CNT1 may have a step in which the width of the first contact hole CNT1 discontinuously changes in the first organic insulating layer 107. That is, the first contact hole CNT1 may include the first portion (hp1, see FIG. 5), which is defined by the second organic insulating layer 109, the second inorganic insulating layer 108, and the upper portion of the first organic insulating layer 107, and the second portion (hp2, see FIG. 5), which is defined by the lower portion of the first organic insulating layer 107 and the first inorganic insulating layer 106. The width of the first portion (hp1, see FIG. 5) of the first contact hole CNT1 may be different from the width of the second portion (hp2, see FIG. 5) of the first contact hole CNT1 in a plan view. In an embodiment, for example, the width of the first portion (hp1, see FIG. 5) of the first contact hole CNT1 may be greater than the width of the second portion (hp2, see FIG. 5) of the first contact hole CNT1.

In the first peripheral area PA1, the connection line 710 may be disposed above the second organic insulating layer 109. The connection line 710 may be a bridge line for electrically connecting the power line 610 to the organic light-emitting diode OLED or the thin-film transistor TFT which is in the display area DA. The connection line 710 may include the same material as the pixel electrode 510. In an embodiment, for example, when the pixel electrode 510 has a stack structure of ITO/Ag/ITO, the connection line 710 may also have the stack structure.

The connection line 710 may contact the power line 610 through the second contact hole CNT2 penetrating the second organic insulating layer 109 and the second inorganic insulating layer 108. The second contact hole CNT2 may be defined by the second inorganic insulating layer 108 and the second organic insulating layer 109.

In the display area DA, the pixel-defining layer PDL may be disposed above the second organic insulating layer 109. An encapsulation layer (not shown) may be disposed to cover the organic light-emitting diode OLED. The encapsulation layer (not shown) may include at least one inorganic encapsulation layer and at least one organic encapsulation layer. The encapsulation layer (not shown) may cover the display area DA and extend to part of the first peripheral area PA1 and the second peripheral area PA2 outside the display area DA.

FIGS. 10A to 10F are schematic cross-sectional views showing processes of manufacturing the display apparatus of FIG. 4B.

First of all, referring to FIG. 10A, the thin-film transistor TFT may be formed on the substrate 100. The thin-film transistor TFT may include the semiconductor layer 220, the gate electrode 230, the first source-drain electrode 310, and the second source-drain electrode 320.

The buffer layer 101 may be formed between the substrate 100 and the semiconductor layer 220, and the gate insulating layer 103 may be formed between the semiconductor layer 220 and the gate electrode 230. The interlayer-insulating layer 105 may be formed between the gate electrode 230 and the first source-drain electrode 310 and the second source-drain electrode 320. The buffer layer 101, the gate insulating layer 103, and the interlayer-insulating layer 105 may each include an inorganic insulating material, such as silicon oxide, silicon nitride, and/or silicon oxynitride, and have a single-layer structure or a multilayered structure including the above material.

The lower metal layer 210 may be formed between the substrate 100 and the semiconductor layer 220. In an embodiment, for example, the lower metal layer 210 may be disposed between the substrate 100 and the buffer layer 101. In an embodiment, the second source-drain electrode 320 may contact the lower metal layer 210 through a contact hole penetrating the interlayer-insulating layer 105 and the buffer layer 101.

The first source-drain electrode 310 and the second source-drain electrode 320 may each have a multilayered structure. The first source-drain electrode 310 may include the first sub-layer 311 and the second sub-layer 313, and the second source-drain electrode 320 may include the third sub-layer 321 and the fourth sub-layer 323. The first sub-layer 311 and the third sub-layer 321 may be formed through the same deposition process. Likewise, the second sub-layer 313 and the fourth sub-layer 323 may be formed through the same deposition process.

The first inorganic insulating layer 106 and the first organic insulating layer 107 may be sequentially formed on the entire substrate 100 to cover the first source-drain electrode 310 and the second source-drain electrode 320. The first inorganic insulating layer 106 may include silicon oxide, silicon nitride, and/or silicon oxynitride. The first organic insulating layer 107 may include an organic insulating material.

A previous contact hole pCNT1 may be formed to overlap the second source-drain electrode 320 in a plan view. The previous contact hole pCNT1 may include a previous sub-hole 107*hp* and a third groove 106GR. The previous sub-hole 107*hp* may be defined through the first organic insulating layer 107, and the third groove 106GR may be defined on the first inorganic insulating layer 106. The third groove

106GR may be formed as a portion (i.e., upper portion) of the first inorganic insulating layer 106 is etched through the previous sub-hole 107*hp*. That is, the first inorganic insulating layer 106 may not be fully etched through the previous sub-hole 107*hp*, and at least a portion (i.e., lower portion) of the first inorganic insulating layer 106 may remain such that the first inorganic insulating layer 106 may still cover the upper surface of the second source-drain electrode 320. The thickness of the remaining portion of the first inorganic insulating layer 106, which overlaps the third groove 106GR, may be between about 300 angstroms (Å) and about 5000 Å. Therefore, the damage to the upper surface of the second source-drain electrode 320 during subsequent processes may be effectively prevented or reduced.

Then, an inorganic insulating layer may be formed on the first organic insulating layer 107 through CVD. The inorganic insulating layer may include silicon oxide, silicon nitride, and/or silicon oxynitride. Next, a first conductive layer and a second conductive layer, which include different conductive materials, may be sequentially formed. In an embodiment, for example, the first conductive layer may include Ti, and the second conductive layer may include Al and/or Cu. A third conductive layer may be formed on the second conductive layer. The third conductive layer may include metal oxide. In an embodiment, for example, the metal oxide may include ITO. The first conductive layer, the second conductive layer, the third conductive layer, and the inorganic insulating layer may be formed on the entirety of the substrate 100.

The first conductive layer, the second conductive layer, the third conductive layer, and the inorganic insulating layer may be patterned through the same mask process. As shown in FIG. 10B, the first conductive layer may be patterned, and thus, the first conductive layer 611 of the power line 610 and the fourth conductive layer 621 of the pad PAD may be formed in the first and second peripheral areas PA1 and PA2. The second conductive layer may be patterned, and thus, the second conductive layer 613 of the power line 610 and the fifth conductive layer 623 of the pad PAD may be formed. The third conductive layer may be patterned, and thus, the third conductive layer 615 of the power line 610 and the sixth conductive layer 625 of the pad PAD may be formed. The third conductive layer 615 may include the same material as the sixth conductive layer 625. The inorganic insulating layer may be patterned, and thus, the first protective layer 151 and the second protective layer 153 may be formed.

That is, the first protective layer 151, the first conductive layer 611, the second conductive layer 613, and the third conductive layer 615 may be patterned through the same mask process. Therefore, the shape of the first protective layer 151 may correspond to the shape of the power line 610. Likewise, the second protective layer 153, the fourth conductive layer 621, the fifth conductive layer 623, and the sixth conductive layer 625 may be patterned through the same mask process. Therefore, the shape of the second protective layer 153 may correspond to the shape of the pad PAD.

Referring to FIG. 10C, the second inorganic insulating layer 108 may be formed to cover the power line 610 and the pad PAD. The second inorganic insulating layer 108 may include silicon oxide, silicon nitride, and/or silicon oxynitride. The second inorganic insulating layer 108 may be deposited on the entire substrate 100. The second inorganic insulating layer 108 may directly contact the first inorganic insulating layer 106 through the previous contact hole pCNT1. Since the first inorganic insulating layer 106 remains on the upper surface of the second source-drain electrode 320, the damage to the upper surface of the second source-drain electrode 320 may be effectively prevented or reduced during the patterning process of first protective layer 151 and the second protective layer 153.

The second inorganic insulating layer 108 may directly contact the first protective layer 151 and seal the power line 610 with the first protective layer 151. Likewise, the second inorganic insulating layer 108 may directly contact the second protective layer 153 and seal the pad PAD with the second protective layer 153.

Referring to FIG. 10D, the second organic insulating layer 109 may be formed on the structure described with reference to FIG. 10C. The second organic insulating layer 109 may include an organic insulating material.

In the display area DA, the fourth sub-hole 109*h*1 may be formed to overlap the second source-drain electrode 320 and the previous contact hole pCNT1 in a plan view. In the first peripheral area PA1, the sixth sub-hole 109*h*2 may be formed to overlap the power line 610 in a plan view. In the second peripheral area PA2, the second sub-opening 109OP may be formed to overlap the pad PAD in a plan view. The fourth sub-hole 109*h*1, the sixth sub-hole 109*h*2, and the second sub-opening 109OP may be defined by the second organic insulating layer 109 by penetrating the second organic insulating layer 109 to expose the upper surface of the second inorganic insulating layer 108.

Referring to FIG. 10E, the second inorganic insulating layer 108, the first organic insulating layer 107, and the first inorganic insulating layer 106 may be etched through the fourth sub-hole 109*h*1, the sixth sub-hole 109*h*2, and the second sub-opening 109OP.

In the display area DA, the second inorganic insulating layer 108, and the remaining lower portion of the first inorganic insulating layer 106 may be further etched through the fourth sub-hole 109*h*1, and thus, the first contact hole CNT1 may be formed, where the first contact hole CNT1 penetrates the second organic insulating layer 109, the second inorganic insulating layer 108, the first organic insulating layer 107, and the first inorganic insulating layer 106. In other words, the first sub-hole 106*h*, the second sub-hole 107*h*, the third sub-hole 108*h*1, and the fourth sub-hole 109*h*1, which overlap each other, may form the first contact hole CNT1.

The first contact hole CNT1 may include the first portion hp1, which is defined by the second organic insulating layer 109, the second inorganic insulating layer 108, and the upper portion of the first organic insulating layer 107, and the second portion hp2, which is defined by the lower portion of the first organic insulating layer 107 and the first inorganic insulating layer 106. The width of the first portion hp1 of the first contact hole CNT1 may be different from the width of the second portion hp2 of the first contact hole CNT1. In an embodiment, for example, the width of the first portion hp1 of the first contact hole CNT1 may be greater than the width of the second portion hp2 of the first contact hole CNT1 in a plan view.

As the first contact hole CNT1 is formed through multiple deposition processes, the erosion of the upper surface of the fourth sub-layer 323 of the second source-drain electrode 320 may be prevented or reduced. Also, during the manufacture of the display apparatus, the exposure of the upper surface of the fourth sub-layer 323 of the second source-drain electrode 320 may be reduced, and thus, the damage to the fourth sub-layer 323 by gases, etc. generated from the first organic insulating layer 107 may be effectively prevented or reduced.

In the first peripheral area PA1, the second inorganic insulating layer 108 may be etched through the sixth sub-hole 109*h*2, and thus, the second contact hole CNT2 penetrating the second inorganic insulating layer 108 and the second organic insulating layer 109 may be formed. In other words, the fifth sub-hole 108*h*2 and the sixth sub-hole 109*h*2, which overlap each other, may form the second contact hole CNT2. In the process of forming the second contact hole CNT2, a portion of the third conductive layer 615 of the power line 610 may also be removed. As described above with reference to FIG. 6, the third conductive layer 615 may define the first groove (615GR, see FIG. 6) overlapping the second contact hole CNT2. The third conductive layer 615 may effectively prevent or reduce the damage to the power line 610 while the second contact hole CNT2 is formed.

In the second peripheral area PA2, the opening OP penetrating the second inorganic insulating layer 108 and the second organic insulating layer 109 may be formed by etching the second inorganic insulating layer 108 through the second sub-opening 109OP. The first sub-opening 108OP and the second sub-opening 109OP, which overlap each other, may form the opening OP. In the process of forming the opening OP, a portion of the sixth conductive layer 625 of the pad PAD may also be removed. As described above with reference to FIG. 7, the sixth conductive layer 625 may define the second groove (625GR, see FIG. 6) overlapping the opening OP. The sixth conductive layer 625 may effectively prevent or reduce the damage to the pad PAD in the process of forming the opening OP.

Figure 10F:
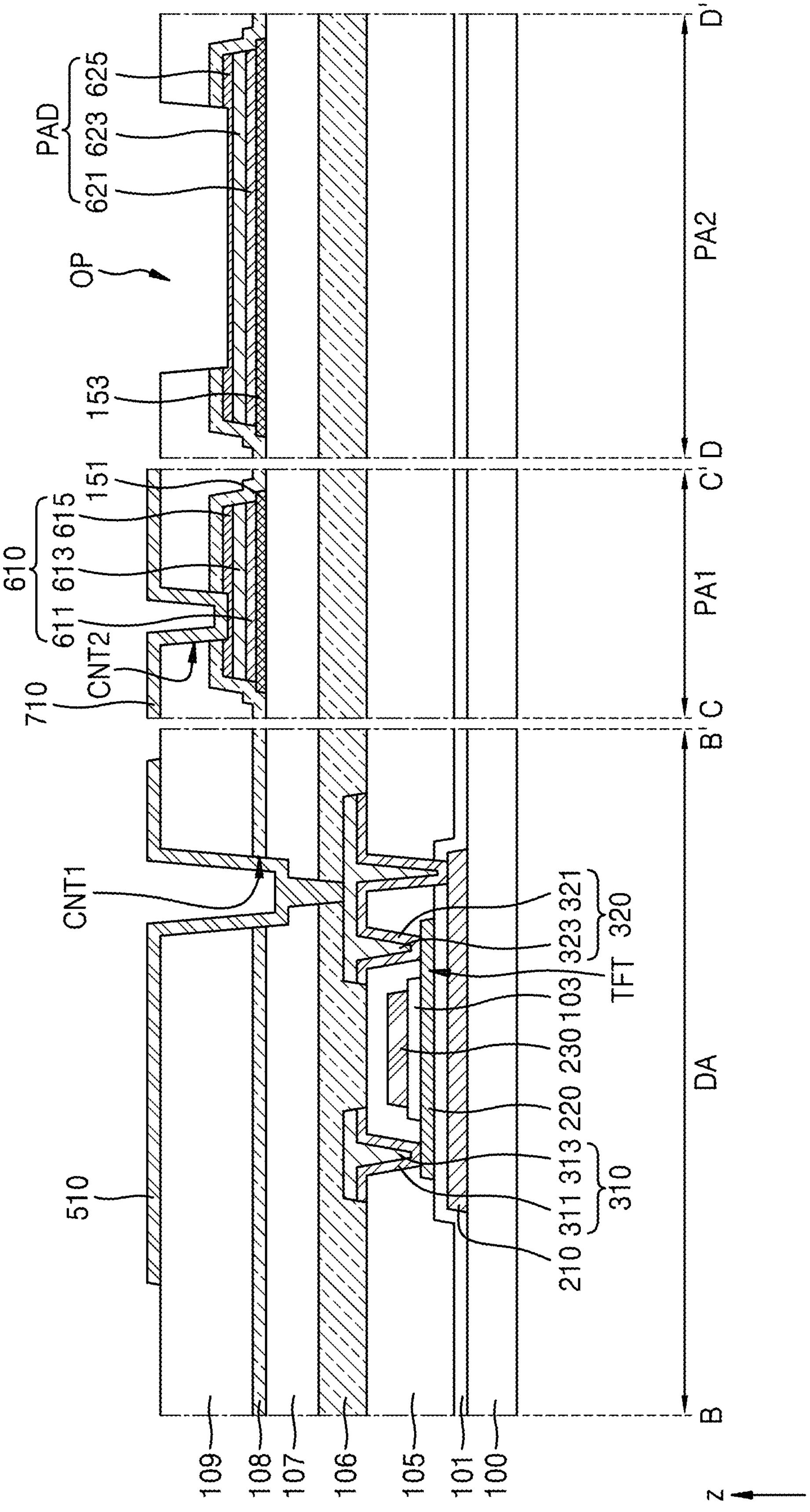

Referring to FIG. 10F, the pixel electrode 510 and the connection line 710 may be formed on the structure described with reference to FIG. 10E. The pixel electrode 510 may contact the second source-drain electrode 320 through the first contact hole CNT1. The connection line 710 may contact the power line 610 through the second contact hole CNT2.

According to a display apparatus and a method of manufacturing the same according to the one or more embodiments, the first source-drain electrode 310 and the second source-drain electrode 320 are arranged on a different layer from the power line 610, and thus, a high-resolution display apparatus may be realized. Also, as the power line 610 is separated from the first organic insulating layer 107 and the second organic insulating layer 109 by the first protective layer 151 and the second inorganic insulating layer 108, the damage to the power line 610 may be effectively prevented or reduced without an additional process, such as a preheating process.

According to the one or more embodiments, a display apparatus with a low occurrence rate of defects during manufacturing and a method of manufacturing the same may be realized. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a transistor disposed above a substrate and comprising a semiconductor layer, a gate electrode overlapping the semiconductor layer, and at least one source-drain electrode;
a first inorganic insulating layer disposed above the transistor;
a first organic insulating layer disposed above the first inorganic insulating layer;
a power line disposed above the first organic insulating layer and comprising a first conductive layer and a second conductive layer on the first conductive layer;
a first protective layer disposed between the first organic insulating layer and the power line and having a shape corresponding to a shape of the power line in a plan view;
a second inorganic insulating layer disposed above the power line;
a second organic insulating layer disposed above the second inorganic insulating layer; and
a light-emitting diode disposed above the second organic insulating layer and comprising a pixel electrode, an opposite electrode, and an intermediate layer disposed between the pixel electrode and the opposite electrode.

2. The display apparatus of claim 1, wherein the pixel electrode is electrically connected to the at least one source-drain electrode through a first contact hole,
the first contact hole comprises a first portion, which is defined by the second organic insulating layer, the second inorganic insulating layer, and an upper portion of the first organic insulating layer, and a second portion, which is defined by the first inorganic insulating layer and a lower portion of the first organic insulating layer, and
at a border between the first portion and the second portion, the first portion has a first width, and the second portion has a second width that is less than the first width in the plan view.

3. The display apparatus of claim 2, wherein the border between the first portion and the second portion is located between an upper surface and a lower surface of the first organic insulating layer.

4. The display apparatus of claim 1, further comprising:
a pad comprising a fourth conductive layer, a fifth conductive layer, and a sixth conductive layer, which are sequentially stacked between the first organic insulating layer and the second inorganic insulating layer; and
a second protective layer disposed between the first organic insulating layer and the pad and having a shape corresponding to a shape of the pad in the plan view,
wherein the sixth conductive layer comprises metal oxide.

5. The display apparatus of claim 4, further comprising a pad opening defined by the second inorganic insulating layer and the second organic insulating layer and overlapping the pad in the plan view.

6. The display apparatus of claim 4, wherein the power line further comprises a third conductive layer disposed between the second conductive layer and the second inorganic insulating layer, and
the sixth conductive layer comprises a same material as the third conductive layer.

7. The display apparatus of claim 1, further comprising:
a pad disposed between the substrate and the first inorganic insulating layer and comprising a fourth conductive layer, a fifth conductive layer, and a sixth conductive layer, which are sequentially stacked; and a pad opening defined by the first inorganic insulating layer and the first organic insulating layer and overlapping the pad in the plan view, wherein the sixth conductive layer comprises metal oxide.

8. The display apparatus of claim 7, wherein the at least one source-drain electrode comprises a first sub-layer, a second sub-layer, and a third sub-layer, which are sequentially stacked, and the sixth conductive layer comprises a same material as the third sub-layer.

9. The display apparatus of claim 1, wherein the second inorganic insulating layer directly contacts the first protective layer.

* * * * *